(12) United States Patent
Schiwon et al.

(10) Patent No.: US 7,674,703 B1
(45) Date of Patent: Mar. 9, 2010

(54) GRIDDED CONTACTS IN SEMICONDUCTOR DEVICES

(75) Inventors: Roberto Schiwon, Hopewell Junction, NY (US); Klaus Herold, Fishkill, NY (US); Jenny Lian, Walkill, NY (US); Sajan Marokkey, Wappingers Falls, NY (US); Martin Ostermayr, LaGrange, NY (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/360,767

(22) Filed: Jan. 27, 2009

(51) Int. Cl.
 *H01L 21/4763* (2006.01)
(52) U.S. Cl. .................. 438/618; 438/597; 438/672; 438/694; 438/736; 438/758; 257/E21.654; 257/E21.679
(58) Field of Classification Search .............. 438/276, 438/596
See application file for complete search history.

(56) References Cited

U.S. PATENT DOCUMENTS 6,553,562 B2   4/2003  Capodicci et al.
6,855,486 B1   2/2005  Finders et al.
2004/0170926 A1*  9/2004  Chandhok ................ 430/311

* cited by examiner

*Primary Examiner*—N Drew Richards
*Assistant Examiner*—Kyoung Lee
(74) *Attorney, Agent, or Firm*—Slater & Matsil, L.L.P.

(57) ABSTRACT

Mask sets, layout design, and methods for forming contacts in devices are described. In one embodiment, a method of manufacturing a semiconductor device includes a exposing a first photo resist layer using a first light beam thereby forming first features. The first exposure is performed by the first light beam passing through a first dipole illuminator and then a first mask. A dipole axis of the first dipole illuminator is oriented in a first direction. After exposing the first photo resist layer, forming second features using a second exposure with a second light beam. The second exposure is performed by the second light beam passing through a second dipole illuminator and then a second mask. A dipole axis of the second dipole illuminator is oriented in a second direction. The first direction and the second direction are not perpendicular. The first and the second features comprise a pattern for forming contact holes.

29 Claims, 23 Drawing Sheets

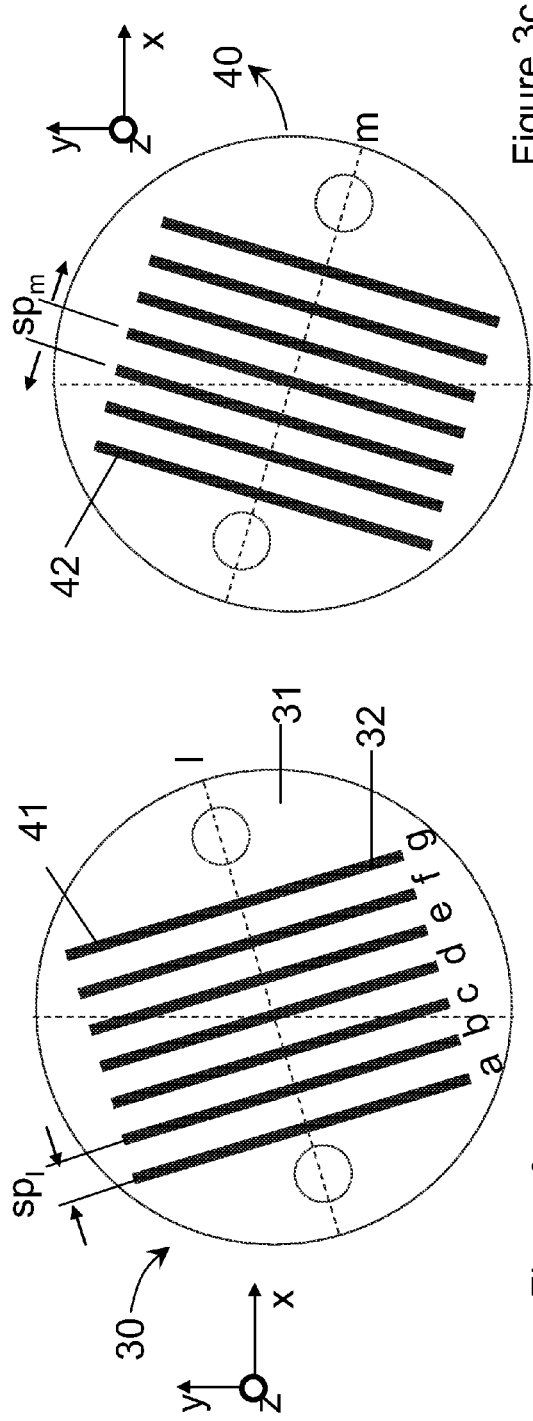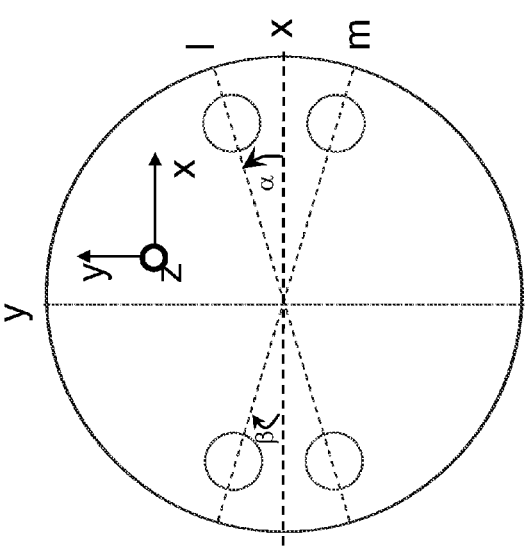
Figure 3a
Figure 3c
Figure 3e

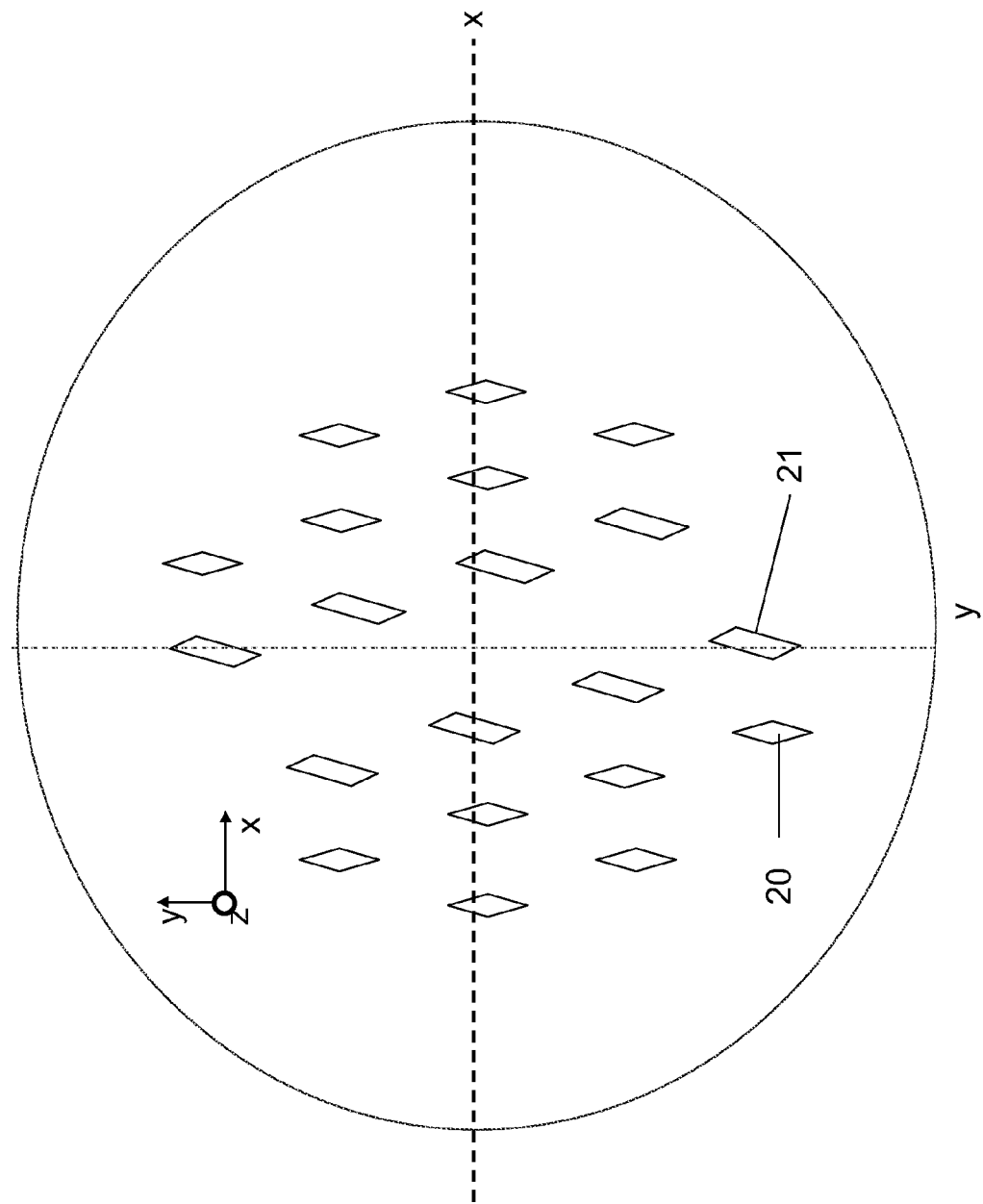

GRIDDED CONTACTS IN SEMICONDUCTOR DEVICES

TECHNICAL FIELD

The present invention relates generally to semiconductor devices, and more particularly to gridded contacts for semiconductor devices and mask sets, layout and methods of forming thereof.

BACKGROUND

Generally, semiconductor devices are used in a variety of electronic applications, such as computers, cellular phones, personal computing devices, and many other applications. Home, industrial, and automotive devices that, in the past, comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semi-conductive and insulating materials that are patterned and etched to form integrated circuits (ICs). There may be a plurality of transistors, memory devices, switches, conductive lines, diodes, capacitors, logic circuits, and other electronic components formed on a single die or chip, for example.

The accurate reproduction of patterns on the surface of a semiconductor substrate is critical to the proper fabrication of semiconductor devices. The semiconductor substrate may have undergone previous fabrication processes and may already feature layers and structures created by those fabrication processes. Improperly reproduced patterns can result in semiconductor devices that do not operate to design specifications or that do not operate at all. For example, transistors can be created with improperly sized gates; conductors can be created that are short circuited or open circuited with other conductors or devices; structures can be created with wrong geometries, and so forth. Improperly reproduced patterns can reduce the yield of the fabrication process, thereby increasing the overall cost of the product. The reproduction process typically involves the use of optical lithography to reproduce the patterns onto the surface of the semiconductor substrate followed by a variety of processes either to subtract (for example, etch) or to add (for example, deposit) materials from and to the semiconductor substrate.

There is a trend in the semiconductor industry toward reducing the size of features, e.g., the circuits, elements, conductive lines, and vias of semiconductor devices, in order to increase performance of the semiconductor devices, for example. The minimum feature size of semiconductor devices has steadily decreased over time. However, as features of semiconductor devices become smaller, it becomes more difficult to pattern the various material layers because of diffraction and other effects that occur during a lithography process. Interference and processing effects can cause distortion and deviation in the mask's patterns as they are reproduced onto the semiconductor substrate. For example, key metrics such as resolution and depth of focus of the imaging systems may suffer when patterning features at small dimensions.

Shrinking device geometries have a particularly acute affect on patterning small contact holes. As contact holes become smaller, masks used to pattern contact holes require smaller apertures. The smaller the aperture, the more difficult it is to get enough light through the aperture to adequately expose the resist disposed on the semiconductor wafer below. If enough light is not used to expose the mask, a pattern will not print on the resist below. If, on the other hand, the mask and semiconductor wafer is exposed to a high intensity light, the exposed pattern below becomes washed out and sidelobes are exposed beyond the desired perimeter of the exposed area. Consequently, the generation and exposure of small contact whole regions requires a very narrow lithographic process window, thereby limiting the range of exposure settings that will produce an adequate exposure. These exposure settings can include illumination or dose, focus, numerical aperture, and light coherence factor, sigma.

Hence, what are needed are methods, designs and structures of producing small geometry contact holes without degrading manufacturing process windows.

SUMMARY OF THE INVENTION

These and other problems are generally solved or circumvented, and technical advantages are generally achieved, by preferred embodiments of the present invention.

Embodiments of the invention include contacts for semiconductor devices. In accordance with a preferred embodiment of the present invention, a method of manufacturing a semiconductor device includes exposing a first photo resist layer using a first light beam thereby forming first features. The first exposure is performed by passing the first light beam through a first dipole illuminator and then a first mask. A dipole axis of the first dipole illuminator is oriented in a first direction. After exposing the first photo resist layer, exposing a second photo resist layer using a second light beam thereby forming second features. The second exposure is performed by passing the second light beam through a second dipole illuminator and then through a second mask. A dipole axis of the second dipole illuminator is oriented in a second direction, wherein the first direction and the second direction are not perpendicular. The first and the second features comprise a pattern for forming contact holes.

The foregoing has outlined, rather broadly, the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 2, which includes

FIG. 4, which includes

FIG. 5, which includes FIGS. 5a-5e, illustrates an embodiment of forming a pattern for contacts using printing assist features that are subsequently erased;

FIG. 7, which includes FIG. 8, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
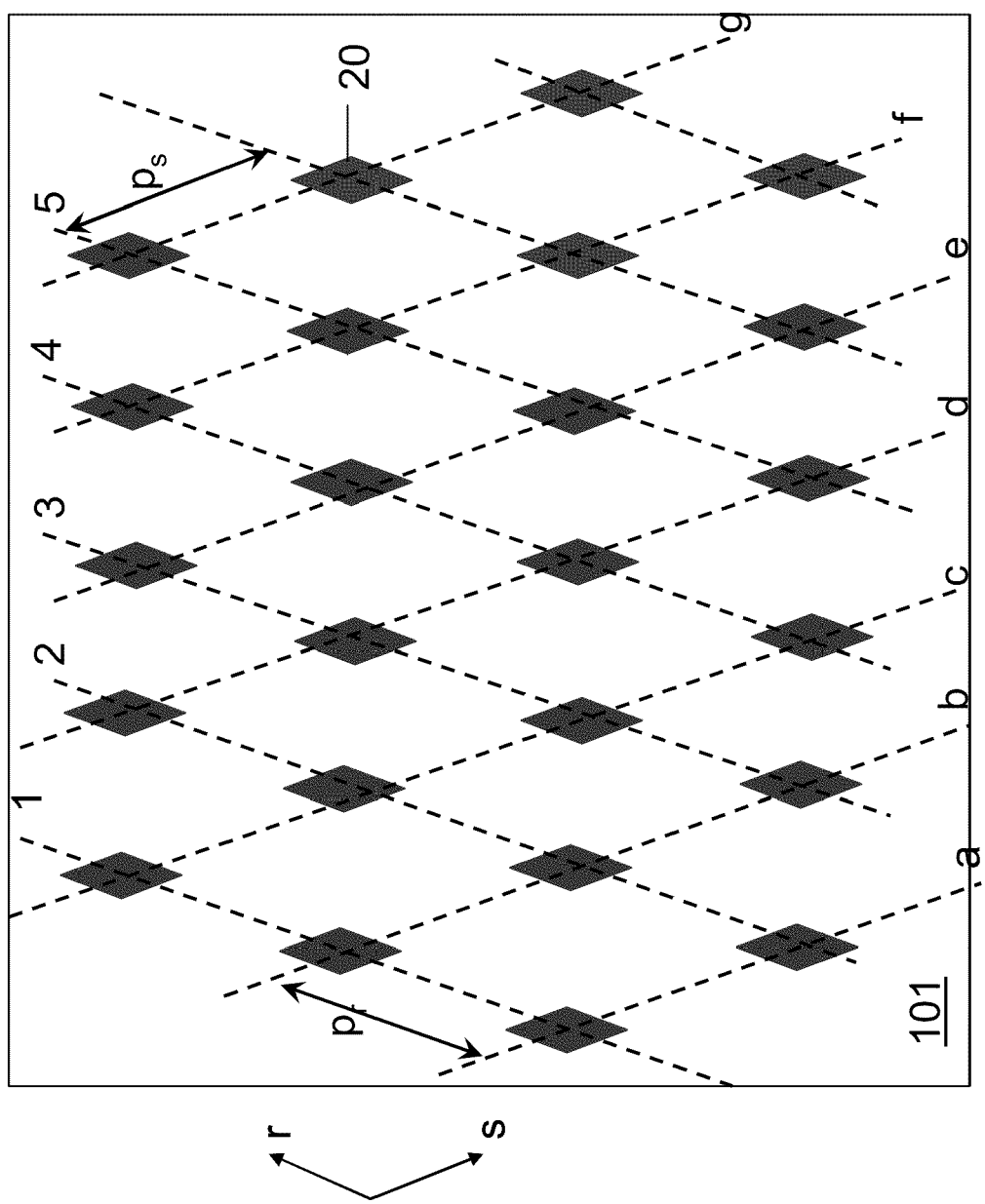
FIG. 1 illustrates an array of contacts formed on a grid in accordance with embodiments of the invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention achieve technical advantages by providing a method to simultaneously increase process margin, yield and product performance using multiple patterning techniques. The present invention will be described with respect to preferred embodiments in a specific context, namely printing contacts for MOS transistors. The invention may also be applied, however, to other types of devices that require contacts such as diodes, bipolar junction transistors, thyristors, and memory devices such as DRAM, FeRAM, phase change memories, or floating gate devices. Similarly, the invention may also be applied to other types of devices in other applications and other technological fields. Embodiments of the invention may be implemented in many types of semiconductor devices, such as logic, memory, peripheral circuitry, power applications, and other types of semiconductor devices, as examples.

The present invention will be described with respect to preferred embodiments in a specific context, namely an optical lithography method for the reproduction of patterns of very small dimensions. This invention may also be applied to semiconductor fabrication processes where other forms of lithography are used, for example, where the wavelength of the electromagnetic waves used to transfer the patterns is on the same order as the pattern dimensions. The present invention can also be used in lithographic processes outside the semiconductor field, for example, in processes where the interaction between wavelength, numerical aperture of the imaging system, and minimum pitch between structures distort the reproduction of mask patterns, or where small features require masks with very small apertures.

One of the challenges in lithography includes the formation of contacts especially narrow contacts, primarily due to narrow process window. Forming contacts in tight spaces, for example, between adjacent gate lines in a scaled cell is extremely challenging as any mistakes result in undesirable shorts or undesirable capacitive coupling between source and gate lines. However, contacts should also be large enough to minimize resistance.

In various embodiments, the present invention overcomes these limitations by using a multiple patterning and freeze technique in contact formation. Instead of forming small apertures in the mask, the contacts are formed by a summation of multiple exposures of non-orthogonal lines formed with multiple masks. The shape of lines in each mask governs the final shape of the contact. Using embodiments of the invention, contacts of desirable dimensions that minimize resistances can be fabricated without degrading process margin.

FIG. 1 illustrates an array of contacts formed on a quadrilateral grid in accordance with embodiments of the invention. Alternate structural embodiments are described with respect to FIG. 2. FIGS. 3, 4, 5, and 8 describe embodiments of methods of fabrication of contacts of a semiconductor device. Embodiments for implementing contacts for a standard logic cell are described with respect to FIGS. 6 and 7.

FIG. 1 illustrates a top cross section of an array of contacts on a semiconductor device fabricated using embodiments of the invention.

Referring to FIG. 1, the contacts 20 formed in an insulating layer 101 couple underlying regions disposed on a workpiece. In various embodiments, the contacts 20 form a rhomboid grid like array. The rhomboid grid is formed by first, second, third, fourth, fifth, sixth, and seventh rows a-g, and first, second, third, fourth, and fifth columns 1-5, the rows being parallel to a first axis s, the columns being parallel to a second axis r. However, the first axis s and the second axis r are not orthogonal. In one embodiment, the first pitch $p_s$ which is the distance between each of the adjacent rows a-g (for example, first, second, third, fourth, fifth, sixth, and seventh rows) is about constant. Similarly, the column spacing or second pitch $p_r$ is about constant thus forming a grid. The first pitch $p_s$ is about the same as the second pitch $p_r$ in one embodiment.

In various embodiments, the first pitch $p_s$ and/or the second pitch $p_r$ is defined by a technology and/or process window of the lithography. In various embodiments, the contacts 20 comprise both contacts to gate regions as well as source/drain contacts. In some embodiments, the vias coupling different metallization levels are also formed on a grid as described above.

Although not explicitly illustrated, in various embodiments, the grid extends over a large area of the semiconductor device. In particular, the same grid extends over a substantial portion of the circuitry. In one embodiment all regions of the chip have a single grid. In another embodiment, the chip is divided into multiple regions with different contact grids. For example, in one chip, an SRAM region comprises a first grid and the logic region comprises a second grid. In another embodiment, a system on a chip comprises a first grid over a first circuitry, for example, analog or RF circuitry, a second grid over a second circuitry, for example, logic circuitry, a third grid over a third circuitry, for example, over a volatile memory region, and fourth circuitry over a non volatile memory.

Figure 2A:
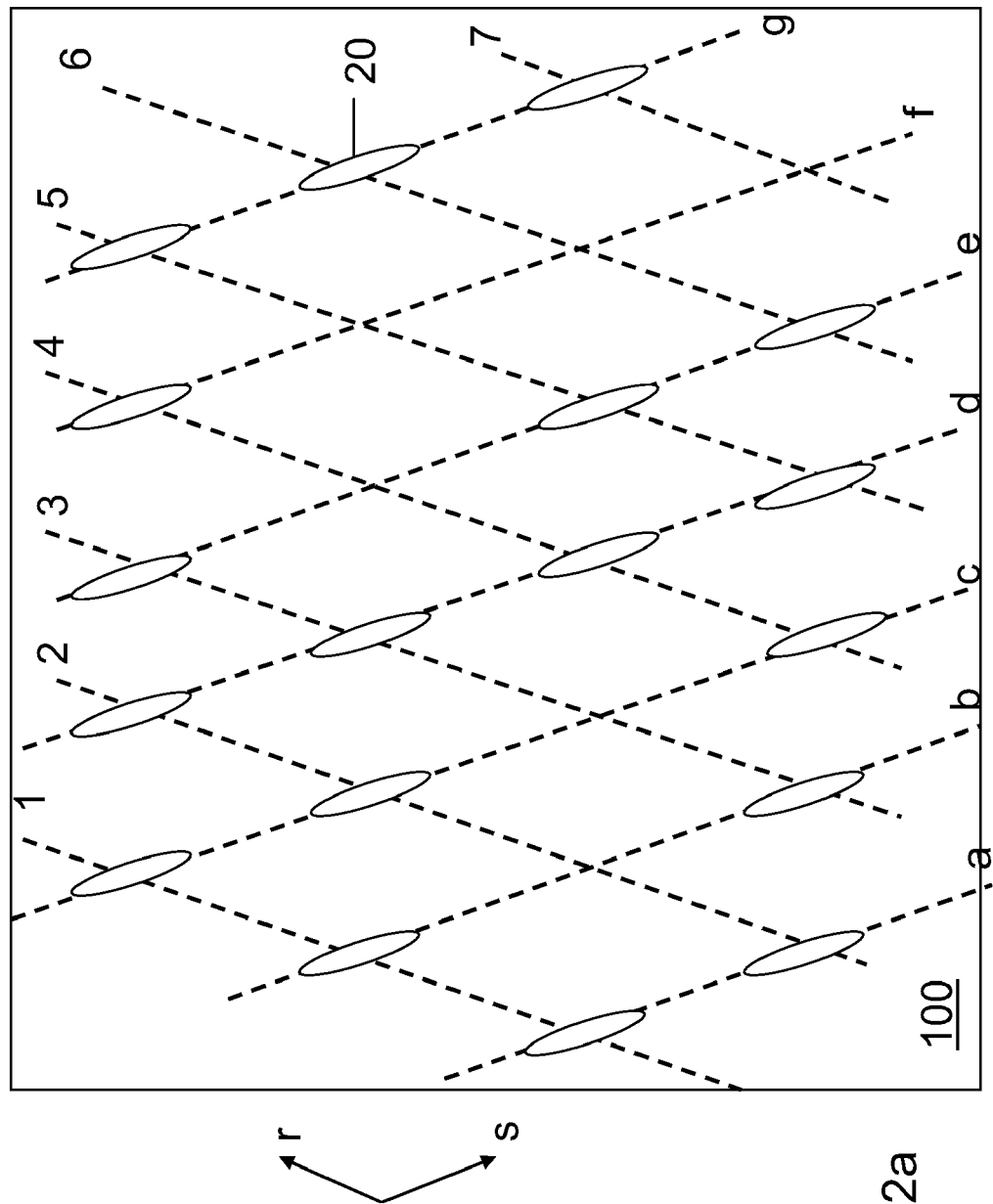
FIGS. 2a and 2b, illustrates alternate shapes of contacts formed in various embodiments of the invention.
Figure 2B:
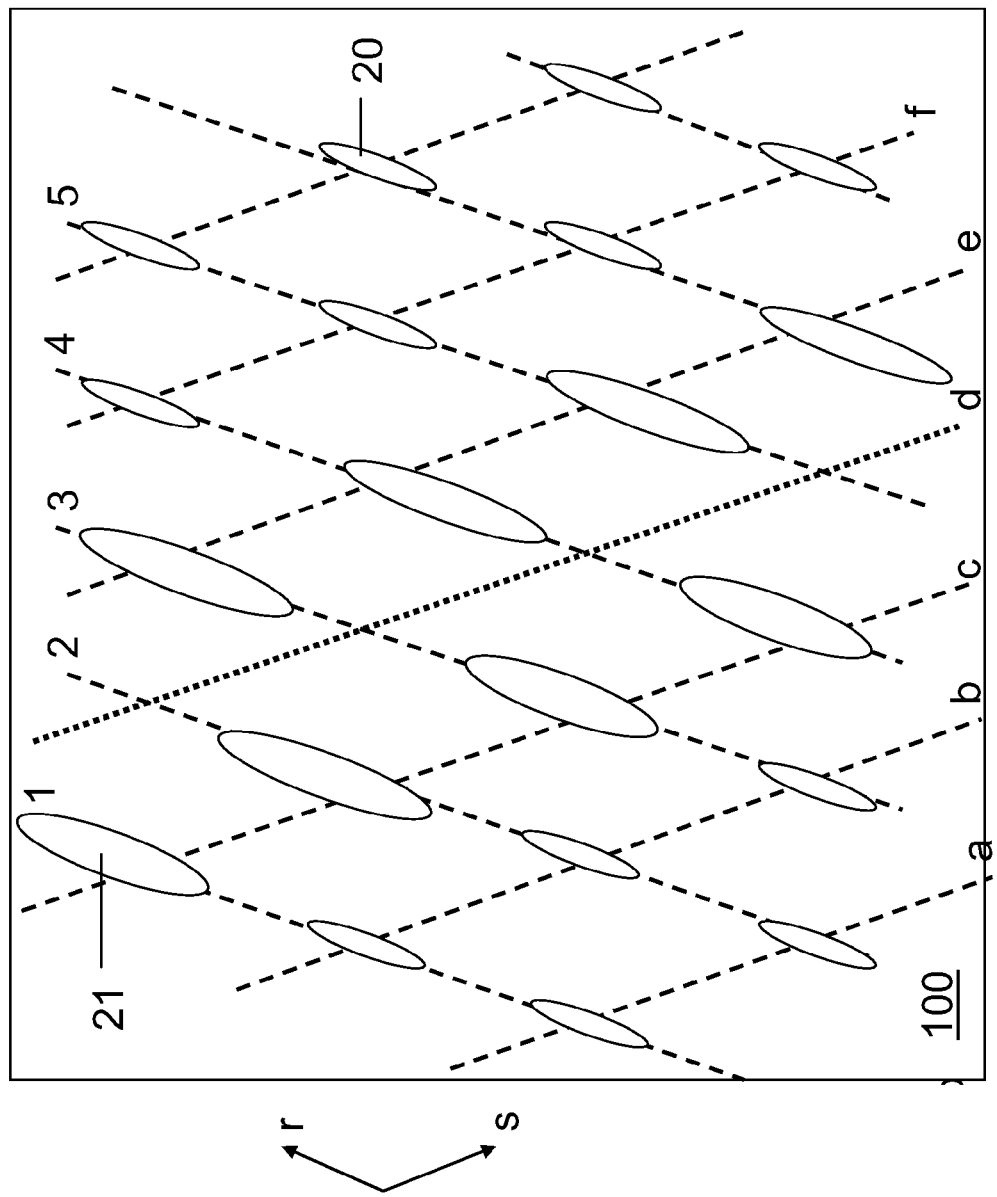

FIG. 2, which includes FIGS. 2a and 2b, illustrates alternate shapes of contacts formed in various embodiments.

In this embodiment, similar to prior embodiment, the contacts 20 are aligned along the first axis s, and along the second axis r. In particular, the contacts 20 are formed at the intersection of first, second, third, fourth, fifth, sixth, and seventh rows 1-7 and first, second, third, fourth, fifth, sixth, and seventh columns a-g. Hence, contacts 20 are formed on intersections a1, a2, b1, b3, c1, c2, c3, d2, d3, d4, d5, e3, e5, e6, f4, g5, g6, and g7.

However, not all intersections of rows and columns form a contact. For example, in FIG. 2a, the intersection b2 of the second row b and the second column 2 do not include a contact. In various embodiments, the contacts 20 can comprise any suitable shape, for example, based on performance or layout requirements. Although FIG. 2 illustrates an oval shape, in other embodiments, the shapes and sizes (hence pitch) can be different.

Similarly, as illustrated in FIG. 2b, the contacts 20 may comprise other dimensions than a contact with minimum dimension. FIG. 2a illustrates a first alternate contact 21 that comprises a different dimension than the minimum dimension. The first alternate contact 21 is longer along the first column 1 than its neighboring contact formed at the intersection of the first column 1 and the second row b. Hence, the distance between adjacent first alternate contacts 21 is larger than other minimum spaced contacts (for example, the distance between the contact formed at intersections a1 and b1).

The minimum dimension for the contact is typically defined by the technology and includes minimization of electrical parameters such as resistance and area while maximizing the process window for the fabrication processes to maximize process yield.

FIG. 3, which includes FIGS. 3a-3i, illustrates steps in fabrication of the contacts in accordance with an embodiment of the invention.

Figure 3B:
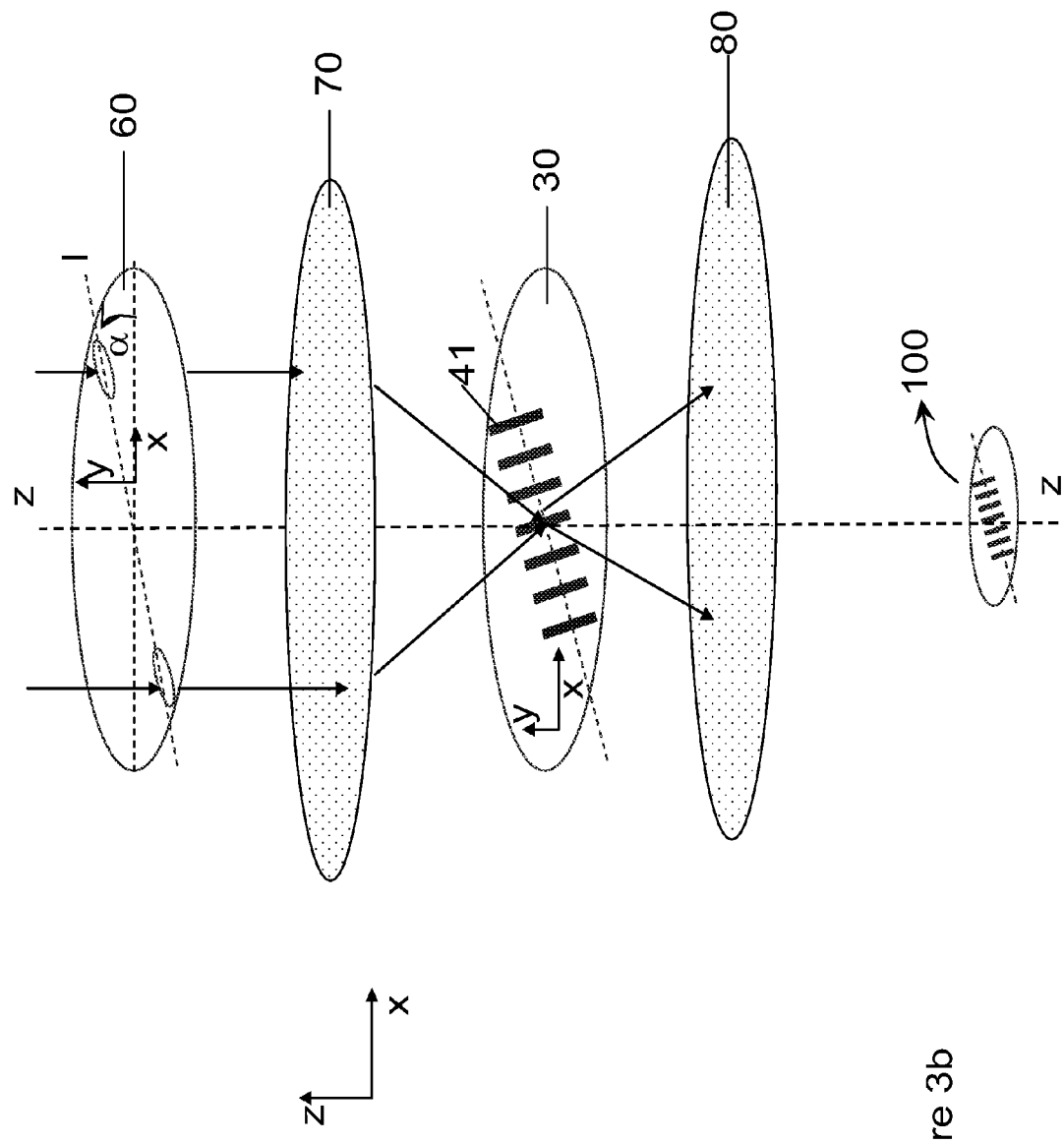
FIG. 3, which includes FIGS. 3a-3i, provides cross-sectional diagrams illustrating a method of fabrication using a first mask, a second mask, and a third mask, in accordance with embodiments of the present invention.
Figure 3D:
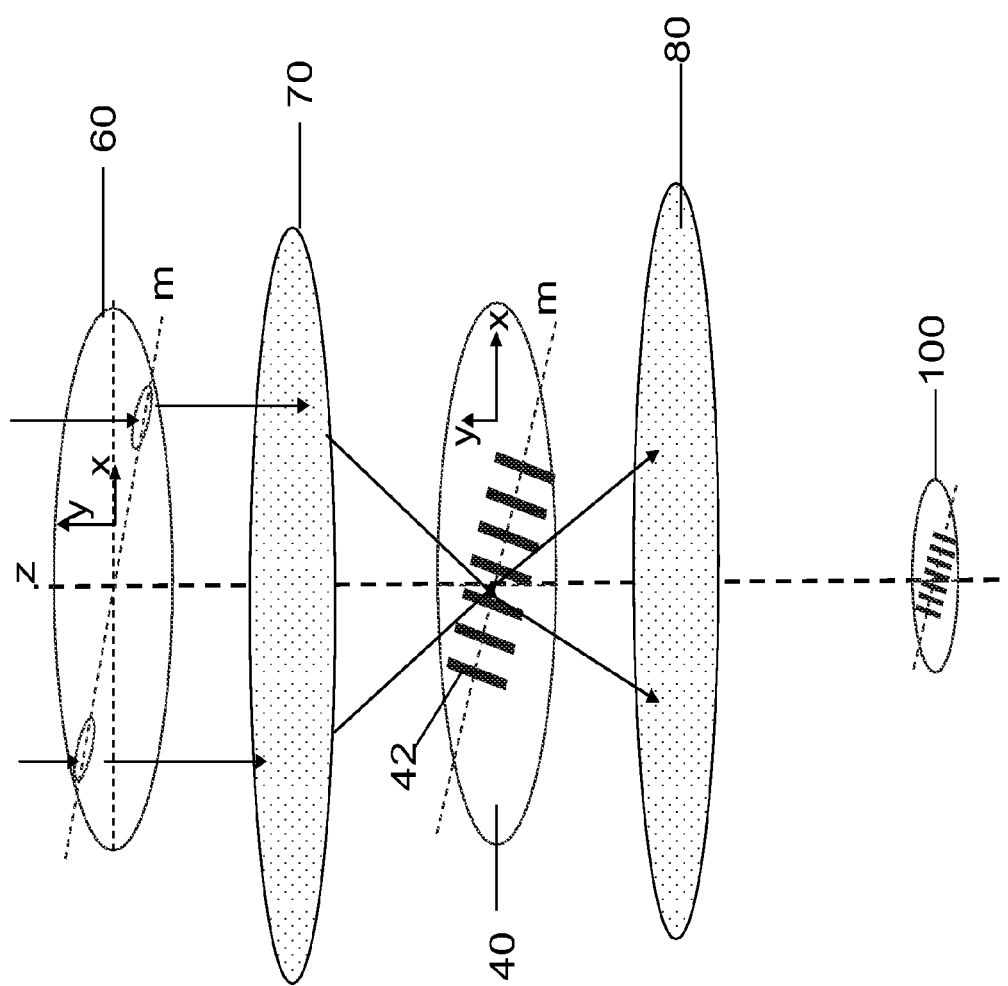
Figures 3F, 3G:
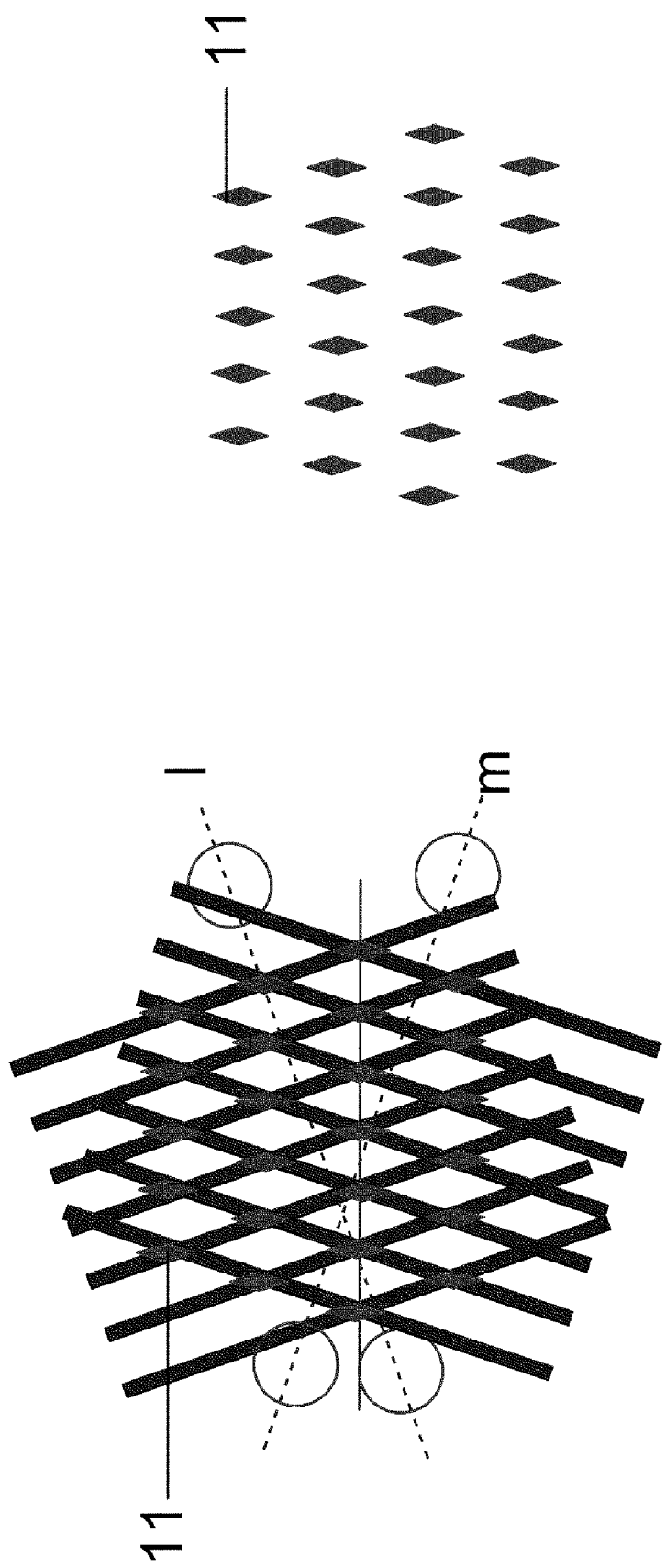
Figure 3H:
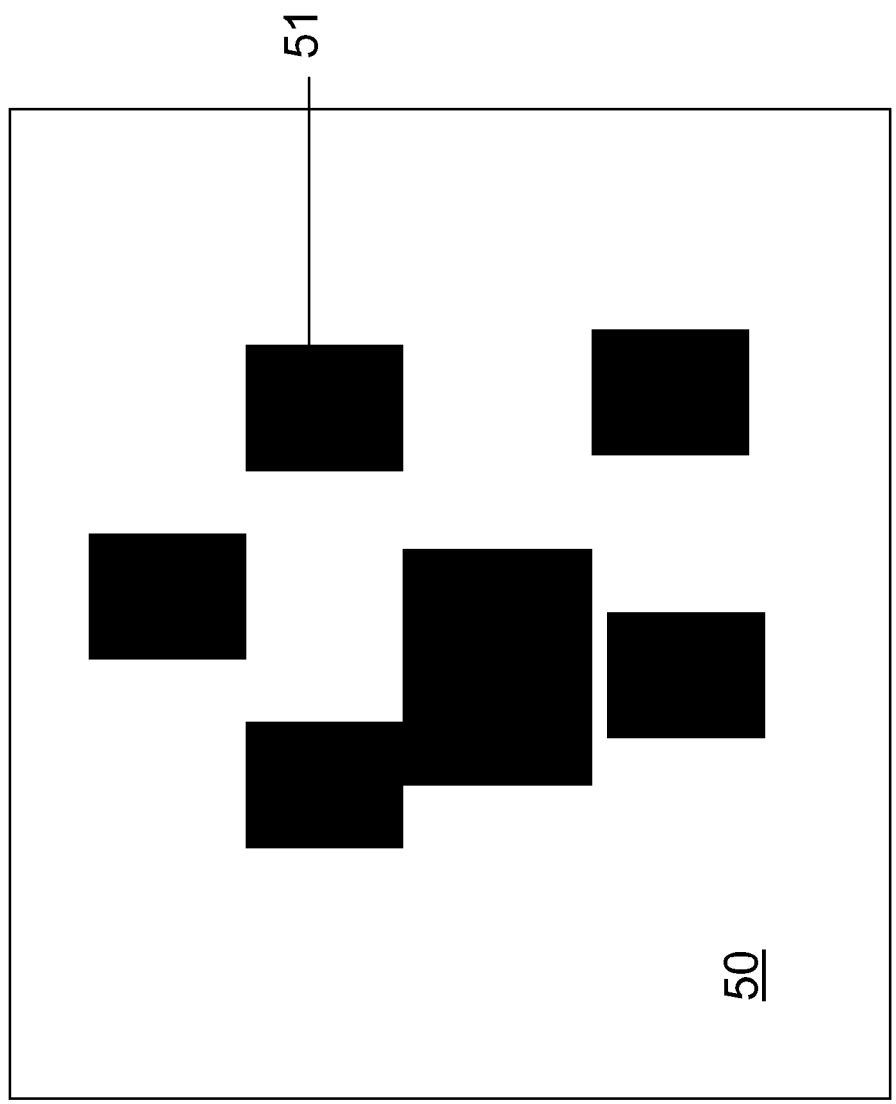

In various embodiments, the contacts 20 described above are fabricated using three exposures with three masks: a first mask 30 (FIG. 3a), a second mask 40 (FIG. 3c), and a third mask 50 (FIG. 3h). In various embodiments, the three exposures are performed using a multiple patterning technique in combination with an off axis illumination technique using dipole illumination.

Before undergoing the lithography step to pattern for contacts, the device is fabricated using conventional processing in front end of the line manufacturing, wherein active device regions are fabricated. During front end processing, device regions including isolation regions, gate electrode, gate dielectric, source/drain regions, source/drain extension regions, and channel regions are fabricated. After forming source/drain regions, a silicide region is formed over the source/drain regions, and optionally over the gate electrode regions.

A first photo resist layer is coated over a first insulating layer (layer to be patterned to form contact openings). The first insulating layer to be patterned is deposited over a substrate. In various embodiments, the active devices are formed on the substrate using conventional processing techniques. For example, in one embodiment, active regions including source/drain regions, source/drain extensions, channel regions, and gate regions of MOS transistors are fabricated on the substrate.

FIG. 3a illustrates the first mask 30 used to expose the first photo resist layer. The first mask 30 comprises a first plurality of lines 41 comprising opaque regions 32 and transparent regions 31. The opaque regions 32 block radiation, and hence are not developed for a positive tone resist. The nearest distance between adjacent opaque regions 32 of the first mask 30 is fixed to a minimum distance, for example, a scaled horizontal pitch $sp_1$.

FIG. 3b illustrates a workpiece 100 being exposed using the first mask 30 in a lithographic tool. The lithography tool comprises a dipole illumination pupil 60, a condenser lens 70, a mask (e.g., first mask 30 in FIG. 3a), a projection lens 80 and the workpiece 100. In various embodiments, the dipole generating means may comprise any suitable means including diffractive optical elements. In dipole illumination, resolution is enhanced for geometrical patterns oriented perpendicular to the pole's axis. Increased focus latitude and image contrast are achieved by using at least one of the first orders of the pattern spatial frequencies to form the image on the workpiece 100.

As illustrated in FIG. 3b, a light beam from the illuminator traveling along the vertical axis (z-axis) of the lithographic imaging tool passes through the dipole illumination pupil 60. Some of the light passes through the condenser lens 70 and diffracted by the features on the first mask 30 and form an image on the workpiece 100. Hence, the patterns on the first mask 30 are transferred to the first photo resist layer on the workpiece using optimum imaging conditions.

FIG. 3b also illustrates the alignment of the dipole illumination pupil 60 with respect to the horizontal axis (x-axis) and transverse axis (y-axis). The horizontal axis x and the transverse axis y are directions that are perpendicular or parallel to the alignment of gate lines in the workpiece 100. Hence, in one embodiment, the first dipole axis 1 of the dipole illumination pupil 60 for the first exposure is aligned at a first angle α with respect to the horizontal axis (x-axis). The features on the first mask 30, e.g., the plurality of lines are aligned perpendicular to the first dipole axis 1.

The first exposure exposes the first photo resist layer through the first mask 30. Thus, the first exposure is used to pattern a plurality of lines on the workpiece oriented in a direction perpendicular to the first dipole axis 1.

The patterned first photo resist layer is frozen by a suitable freezing technique. The suitable freezing techniques can include thermal curing, ion implantation, polymer encasing, or any other surface treatment that changes the first photo resist layer into a frozen resist layer. The frozen resist layer is insoluble to subsequent developer solutions. Alternative embodiments may use an image reversal process.

A second photo resist layer is coated over the frozen resist layer formed from the first mask 30. The second photo resist layer is exposed using the second mask 40 as illustrated in FIG. 3c. The second mask 40 also comprises opaque regions 32 and transparent regions 31. The nearest distance between adjacent opaque regions 32 of the second mask 40 is fixed to a minimum distance, for example, scaled vertical pitch $sp_m$.

The imaging of the second photo resist layer is illustrated in FIG. 3d. Similar to FIG. 3b, a light beam from the illuminator traveling along the vertical axis (z-axis) of the lithographic imaging tool passes through the dipole illumination pupil 60 and is diffracted by the features on the second mask 40 to form an image on the workpiece 100. However, the dipole illumination pupil 60 is aligned in a different direction.

As illustrated in FIG. 3d, the second dipole axis m of the dipole illumination pupil 60 for the second exposure is aligned at a second angle β with respect to the horizontal axis (x-axis). The features on the second mask 40, e.g., the third plurality of lines 42 are aligned perpendicular to the second dipole axis m. The second exposure exposes the second photo resist layer on the workpiece 100 through the second mask 40. In some embodiments, one of the first the second dipole axis may be aligned parallel or perpendicular to the horizontal or vertical axis. Thus, the second exposure is used to pattern a plurality of lines on the workpiece oriented in a direction perpendicular to the second dipole axis m.

For clarity, the alignment of the first and the second dipole axis 1 and m are illustrated in FIG. 3e. In various embodiments, the sum of the first angle α and the second angle β is less than 90 degrees. The superposition of the first mask 30 and the second mask 40 is illustrated in FIG. 3*f* and shows the formation of a pattern for contacts 20. Depending on the type of photo resist (positive or negative), the regions exposed by both the masks form the pattern for contacts 11 or alternately, the regions not exposed by either of the masks form the pattern for contacts 11.

The patterned second photo resist layer is frozen by a suitable freezing technique. Similar to the first photo resist layer, the suitable freezing techniques can include thermal curing, ion implantation, polymer encasing, or any other surface treatment that changes the second photo resist layer into the frozen resist layer.

Figure 3I:
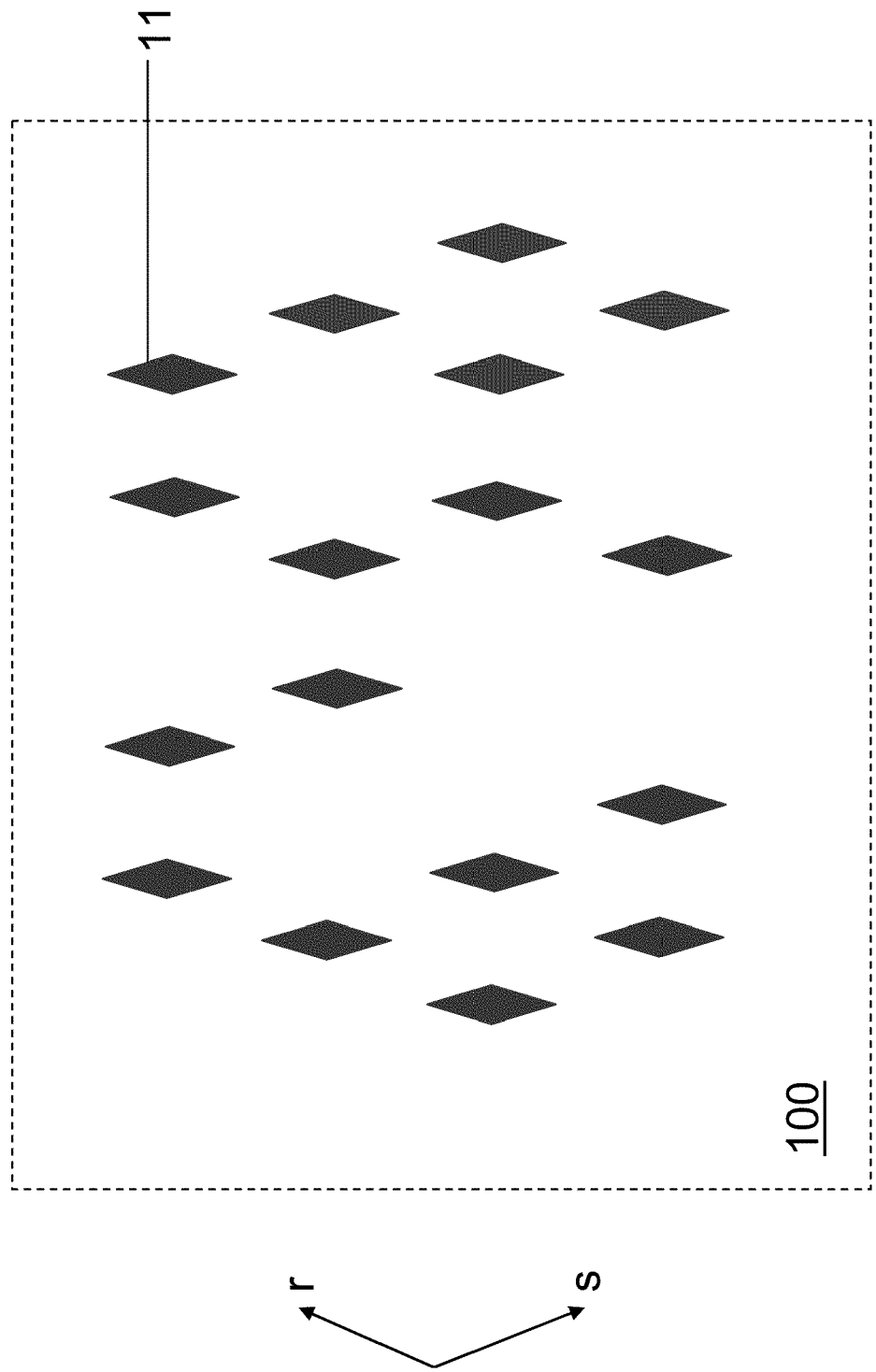

After coating a third photo resist layer, a third exposure using the third mask 50 (FIG. 3*h*) is performed to form the desired array of pattern for contacts 11 (FIG. 3*i*). If the entire grid is used to form contacts, this step can be skipped. The third mask 50 comprises cut features 51 that are opaque in one embodiment. The third mask 50 is used to cut or trim some of the second features from the template layer thus forming a pattern for forming contacts. If the third photoresist layer comprises a positive tone resist, some of the patterned first or second photo regions (and now frozen) are filled up with the third photo resist layer after the third expose, develop, and etch processes. If a negative tone resist is used as the third photo resist layer, some of the patterned first and second photo resist regions may be removed by the cut features 51.

Thus in various embodiments, the mask set avoids the problems of exposing through a small aperture mask as each individual mask level comprises a plurality of lines. By using a flexible dipole illumination system, the illumination conditions are selected to maximize the image quality, for example, minimize across chip line width variation, over a range of process window parameters such as depth of focus, exposure dose and mask error factor. The mask design has been explained in terms of opaque and transparent regions to clearly describe the embodiments of the invention. However, actual mask design and materials can be chosen to incorporate modifications to improve the imaging system. For example, to improve image resolution further, the mask design may comprise attenuated phase shifter materials or alternating phase shift mask materials in opaque regions 32 and transparent regions 31 of FIG. 3*a*. Similarly, to improve depth of focus, the mask design for each layer may comprise OPC features such as hammerheads, serifs, sub-resolution assist features, etc.

Using the pattern for contacts 11, contact holes are etched in the underlying insulating layer. The contact holes are filled with a conductive liner and a conductive material forming the contacts 20 (e.g., FIG. 1). The conductive material preferably comprises W, although copper, aluminum, Al—Cu—Si, other metals and combinations thereof may also be used. If the conductive material comprises W, preferably a bi-layer seed layer comprising CVD titanium nitride and silicon doped tungsten is used. In some embodiments, the contact plug is filled with copper, forgoing forming a conductive liner, which may be problematic in deeply scaled technologies.

In one embodiment, contacts 20 comprise contact plugs that couple conductive regions on substrate 100, for example, silicide regions on substrate. In another embodiment, the contacts 20 comprise contact plugs to couple first metal lines in the metallization layers with gate electrodes of devices disposed on substrate. Subsequent processing continues as in conventional processing. For example, further levels of metallization comprising metal lines and vias are formed over the contacts 20.

Figure 4B:
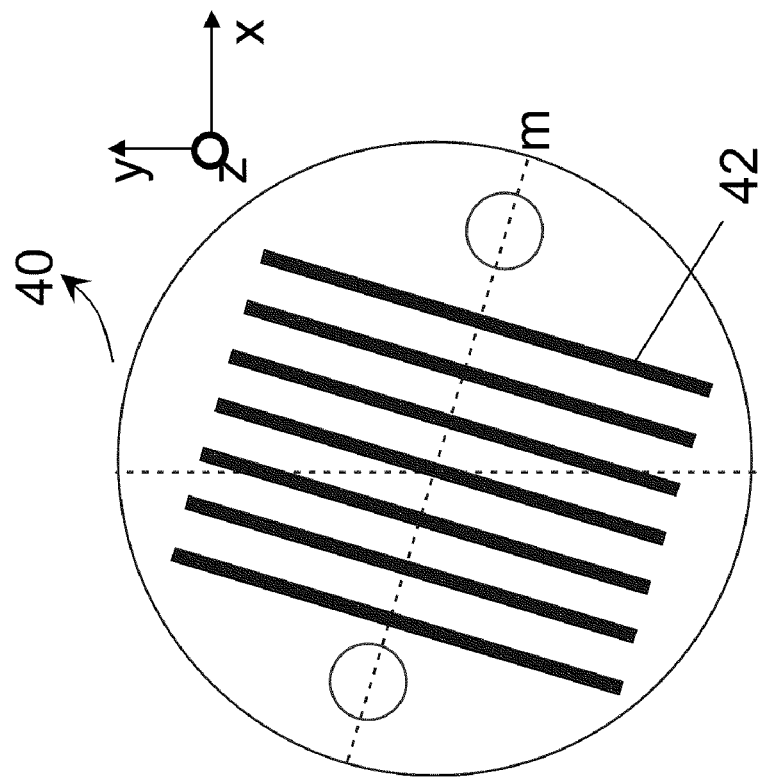
FIGS. 4a-4d, illustrates embodiments of the invention of forming a pattern for contacts, wherein the grid forming the pattern avoids forming a row of contacts by the use of sub resolution assist features.
Figure 4A:
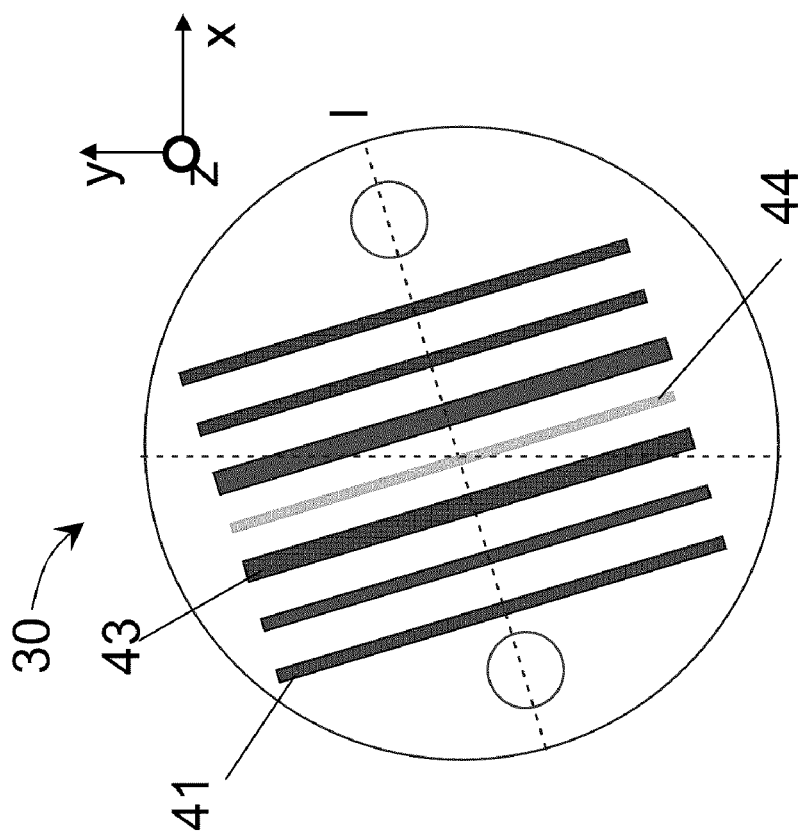
Figure 4C:
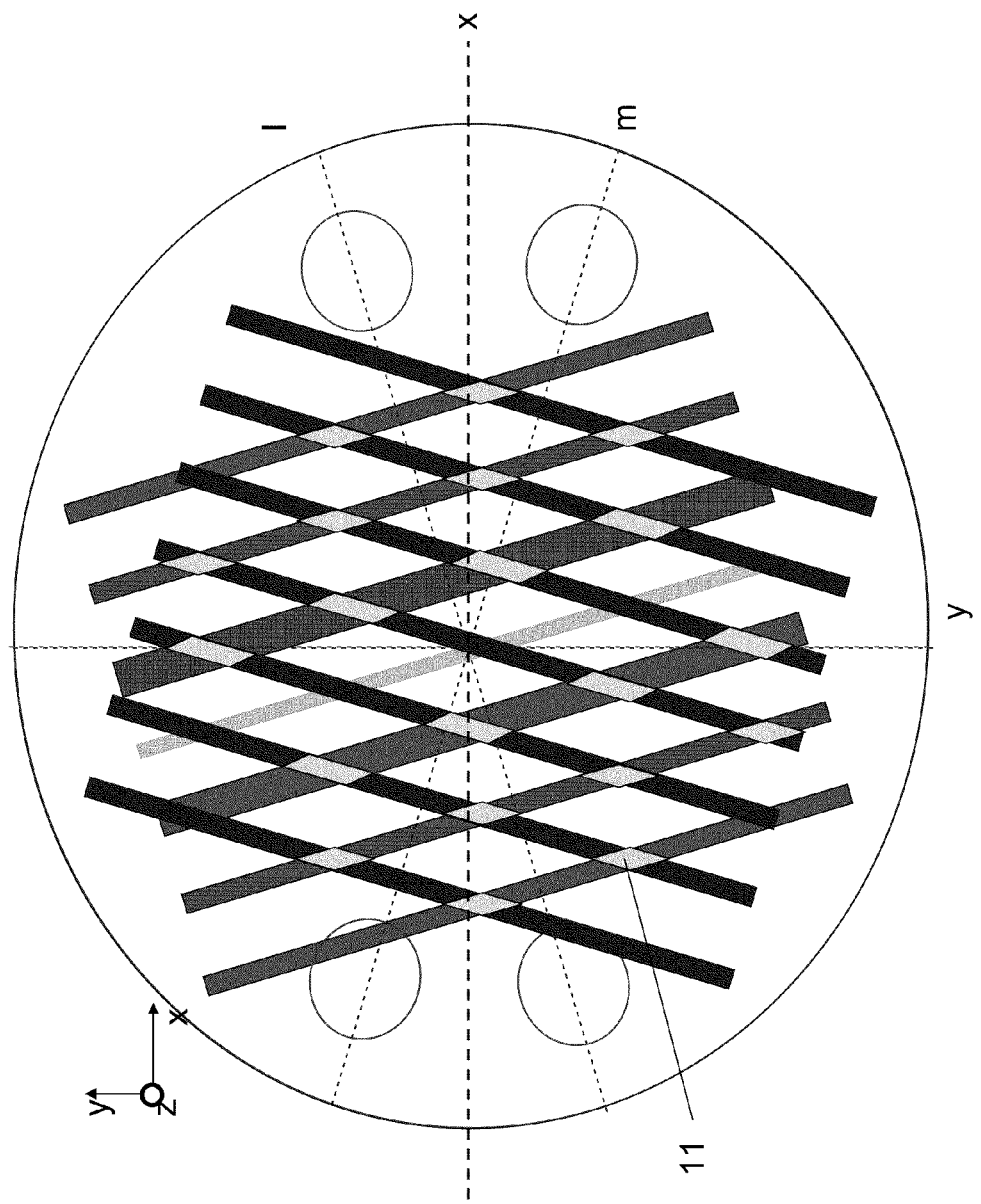
Figure 4D:
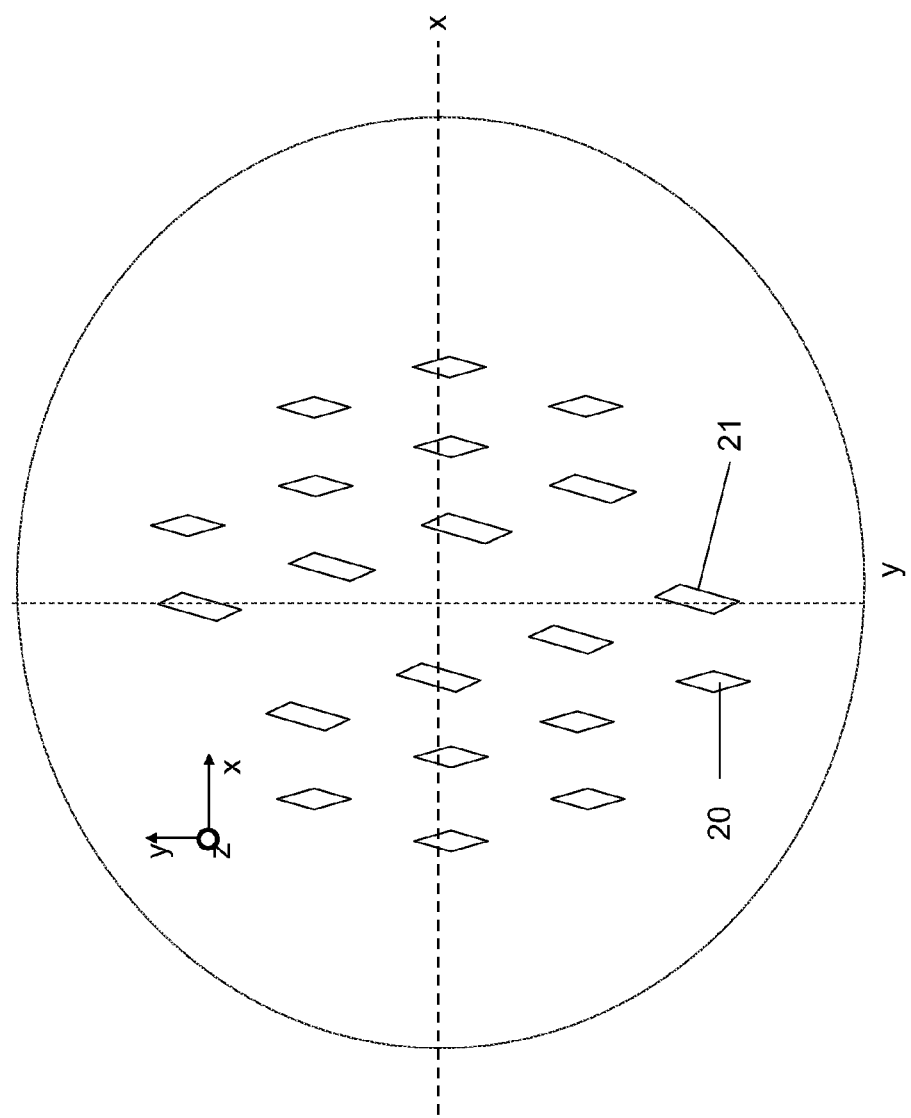

FIG. 4, which includes FIGS. 4*a*-4*d*, illustrates embodiments of the invention using sub resolution assist features. FIG. 4 illustrates an embodiment in which a row of contacts is skipped from the grid of contacts by the use of sub resolution assist features. FIGS. 4*a* and 4*b* illustrate a mask set used in forming the features. FIG. 4*c* illustrates an overlay of the masks, and FIG. 4*d* illustrates features formed using the mask set.

FIG. 4*a* illustrates a first mask 30 comprising a first plurality of lines 41. As in prior embodiments, the grid for contacts comprises first, second, third, fourth, fifth, sixth, and seventh rows a-g. However, unlike the prior embodiment of FIG. 3, not all the rows comprise a first plurality of lines 41. In this embodiment, contacts are skipped from some of the rows (for example, fourth row d in FIG. 4*a*). However, removing a row will result in a poor process window during lithography. Hence, in this embodiment, the rows to be removed are replaced with auxiliary feature 44.

Further, the rows adjacent to the rows being removed correct for the absence of the row, and hence correct for the difference arising due to the absence of a printable line of the first plurality of lines 41 with the presence of the auxiliary feature 44. Thus, the lines adjacent the auxiliary feature 44 compensate for the change in density due to the presence of the auxiliary features 44. For example, if fourth row d is being removed and instead comprises an auxiliary feature 44, the third row c and the fifth row e are corrected. The lines adjacent to the auxiliary feature 44 (line of the fifth row e) are therefore formed wider in the first mask 30. Hence, referring to FIG. 4*a*, the first mask 30 comprises auxiliary feature 44 accompanying a second plurality of lines 43. The second plurality of lines 43 comprise lines of a different pitch than the first plurality of lines 41.

In this embodiment, the auxiliary feature 44 comprises sub resolution assist features. Although only a single auxiliary feature 44 is illustrated in FIG. 4*a*, in other embodiments multiple rows or columns may be replaced with an auxiliary feature 44.

Sub-resolution assist features, also called scatter bars, are features formed on the first mask 30 but are not patterned or printed. For example, sub-resolution assist features typically comprise a plurality of lines significantly thinner than the minimum patternable width or resolution of the exposure tool. These sub-resolution assist features effectively change the pattern density and help improve depth of focus of the exposure system. Consequently, the sub-resolution assist features improve uniformity in printing features of different density, for example, of lines of different thickness. The use of sub-resolution assist features helps to form a pattern of a plurality of lines of varying line widths.

FIG. 4*b* illustrates the second mask 40, oriented at a non-orthogonal angle to the first mask 30 and illustrates the third plurality of lines 42. Although not shown, in various embodiments the second mask 40 may also comprise such auxiliary features.

FIG. 4*c* illustrates an overlay of the pattern formed by the exposures with the first mask 30 and the second mask 40. The dual patterning process, as described above, results in the formation of the pattern for contacts 11. As the second plurality of lines 43 of the first mask 30 are wider than the first plurality of lines 41, the pattern for contacts 11 comprise multiple dimensions and at least two dimensions in one embodiment. However, this is not necessary. In some embodiments, the increase in the width of the second plurality of lines 43 compensates for the absence of the adjacent row or column of lines. Hence, in such embodiments, the second plurality of lines 43 pattern is of the same width as the first plurality of lines 41.

The structure, after forming the contacts 20, is illustrated in FIG. 4d. Referring to FIG. 4d, a first alternate contact 21 is formed due to the larger width of the second plurality of lines 43 of the first mask 30.

Thus, by using auxiliary features 44 (e.g. FIG. 4a) an entire row or column of contacts is removed without any loss of process window. Hence, as described above, in various embodiments if a row or column of contacts needs to be removed in a layout, a separate trim mask is not required. In various embodiments, a separate trim mask may be eliminated because the first and/or second mask may comprise sub resolution features in regions where the contacts are not to be formed.

Figure 5B:
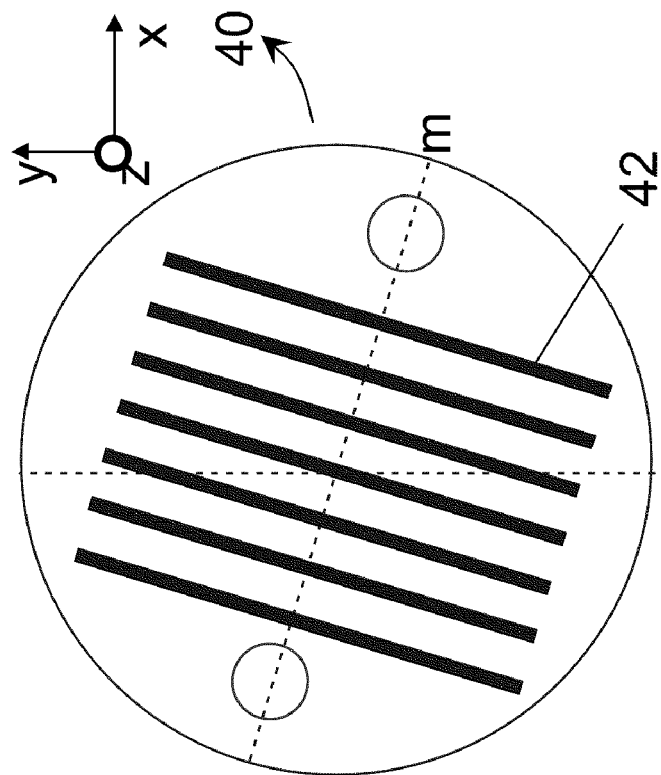
Figure 5A:
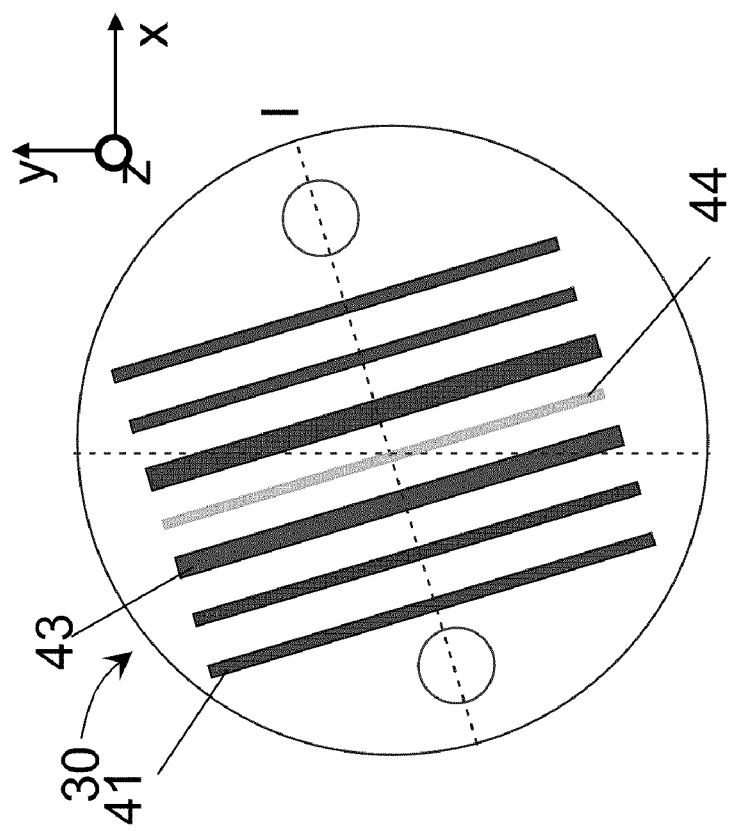
Figure 5C:
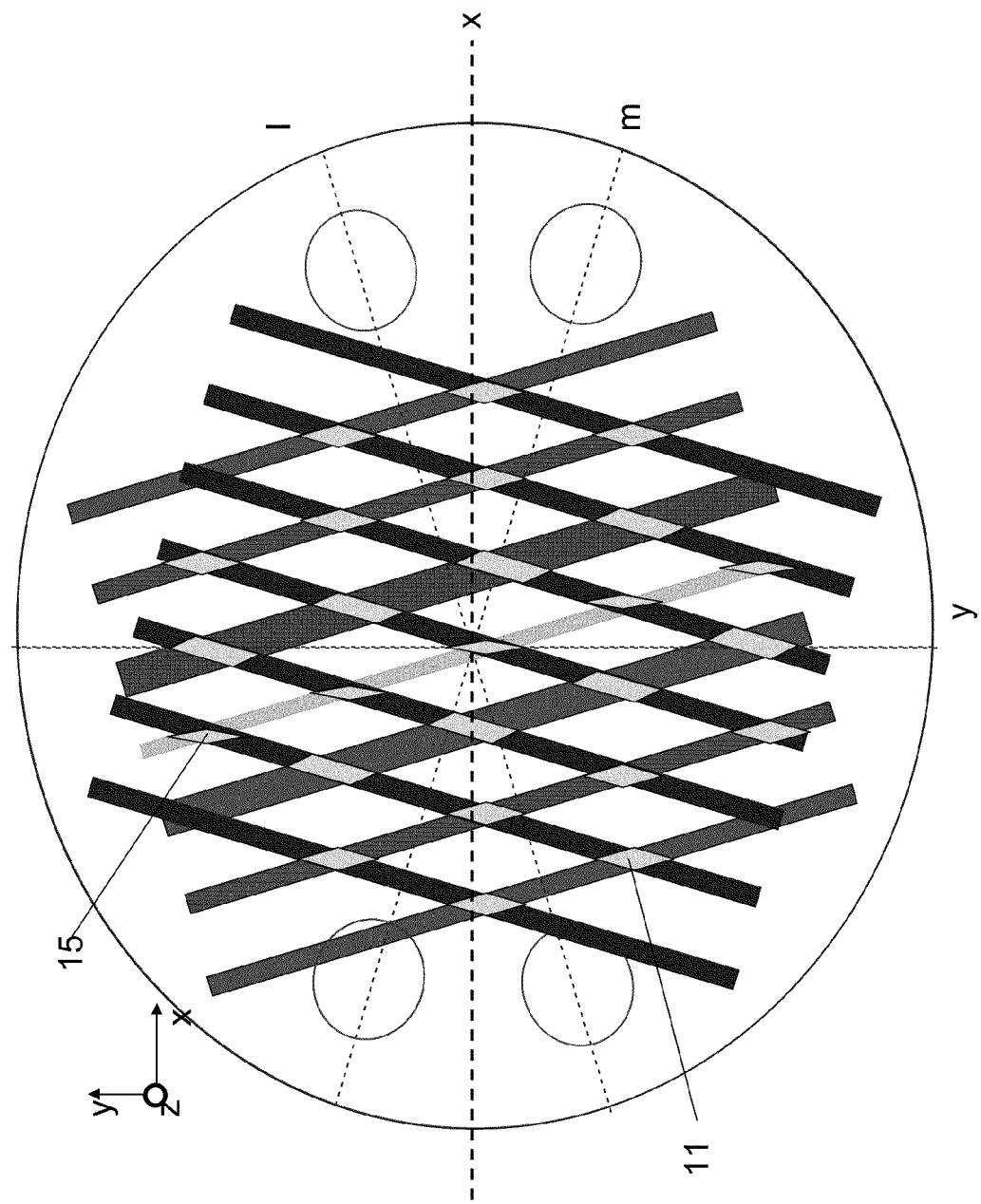
Figure 5D:
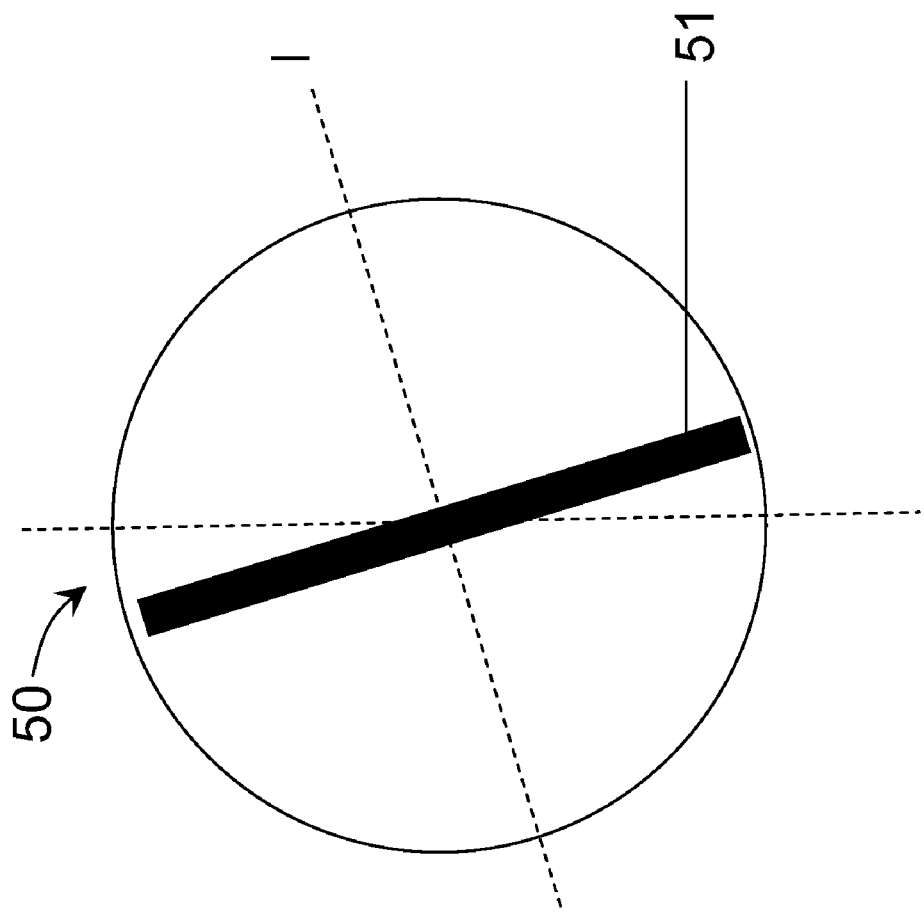

FIG. 5, which includes FIGS. 5a-5e, illustrates embodiments of the invention using printing assist features. FIG. 5 illustrates an embodiment in which a row of contacts is skipped from the grid of contacts by the use of a printing assist features. FIGS. 5a, 5b, and 5d illustrate a mask set used in forming the features, FIG. 5c illustrates an overlay of the first and second masks, and FIG. 5e illustrates features formed using the mask set.

In this embodiment, the first mask 30 and/or the second mask 40 contain a number of printing assist features in regions not forming contacts. These printing assist features, such as dummy lines, are printed along with critical features. Printing assist features, also called dummy features, are typically introduced in the layout to improve the quality of the transfer of neighboring lines. Such dummy features reduce the difference in pitch between wider and narrower pitch structures. Printing assist features are used similar to the sub resolution scatter bars of prior embodiments when a row of contacts is not required to be formed in a particular region.

The use of printing assist features enables the optimization of lithography process conditions to increase the common process window. The printing assist features are removed in a subsequent process step by exposing these additional features to a third mask (e.g., trim mask of FIG. 5d).

FIG. 5a illustrates a first mask 30 comprising a first plurality of lines 41. Similar to the embodiment of FIG. 4, the first mask 30 further comprises auxiliary features 44 accompanying a second plurality of lines 43. The second plurality of lines 43 comprises lines of a different pitch than the first plurality of lines 41. In this embodiment, the auxiliary features 44 comprise printing assist features. FIG. 5b illustrates the second mask 40 oriented at a non-orthogonal angle to the first mask 30 and third plurality of lines 42. Although not shown, in various embodiments, the second mask 40 may also comprise such auxiliary features.

FIG. 5c illustrates an overlay of the pattern formed by the exposures with the first mask 30 and the second mask 40. The triple patterning process as described above results in the formation of the pattern for contacts 11. As the second plurality of lines 43 of the first mask 30 are wider than the first plurality of lines 41, the pattern for contacts 11 comprise multiple dimensions and at least two dimensions in one embodiment. As illustrated, the pattern for contacts 11 also comprises dummy contacts 15 that are formed due to the auxiliary features 44 of the first mask 30. The dummy contacts 15 are removed using the third mask 50, which comprises cut features 51 (FIG. 5d). The cut features 51 are opaque or transparent depending on the type of resist used.

The structure, after forming the contacts, is illustrated in FIG. 5e. Referring to FIG. 5e, a first alternate contact 21 is formed due to the larger width of the second plurality of lines 43 of the first mask 30. Although not shown, in various embodiments, the second mask 40 may also comprise such auxiliary features.

Figure 6A:
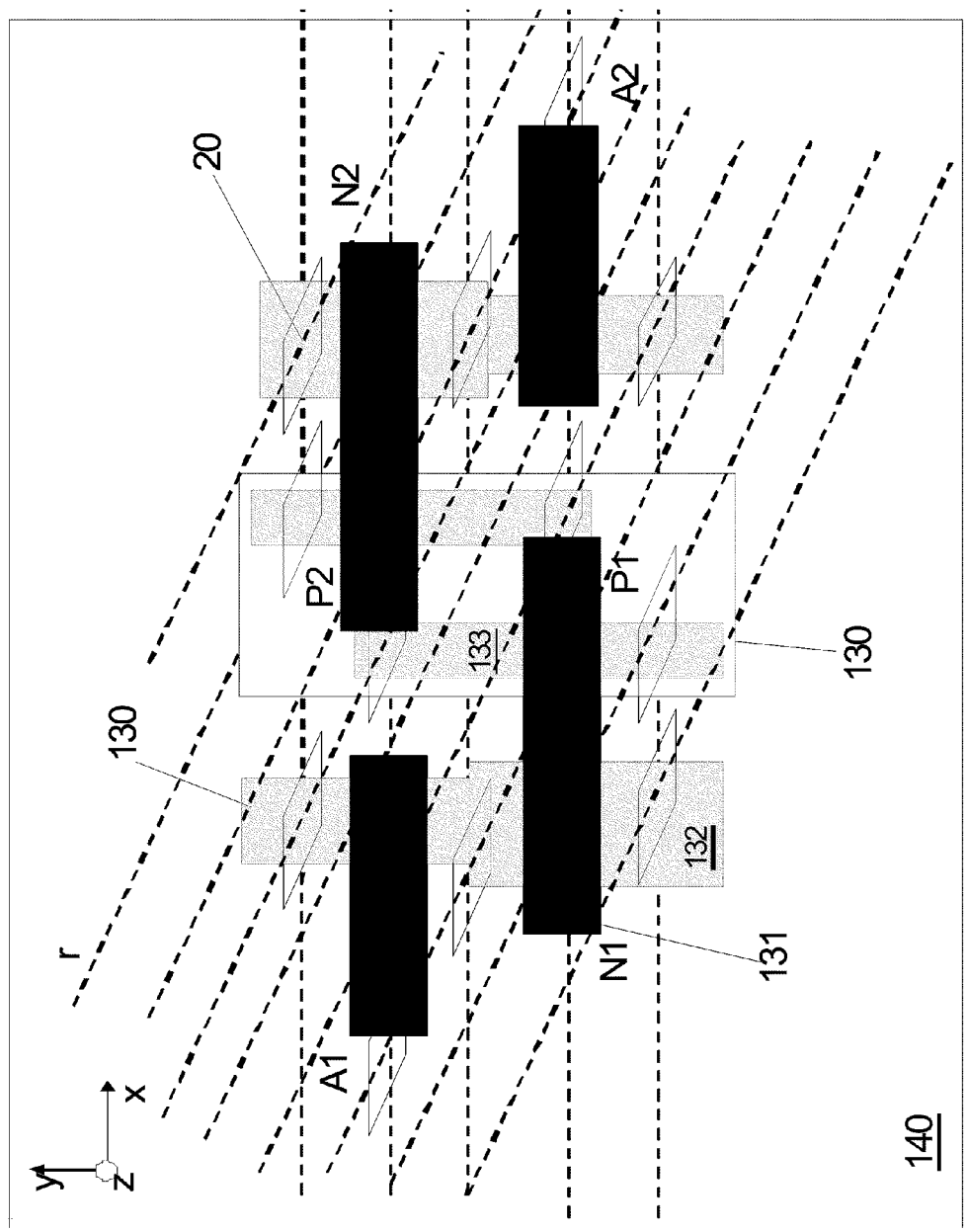
FIG. 6, which includes 6a and 6b, illustrates a 6T SRAM cell designed or fabricated in accordance with embodiments of the invention.
Figure 6B:
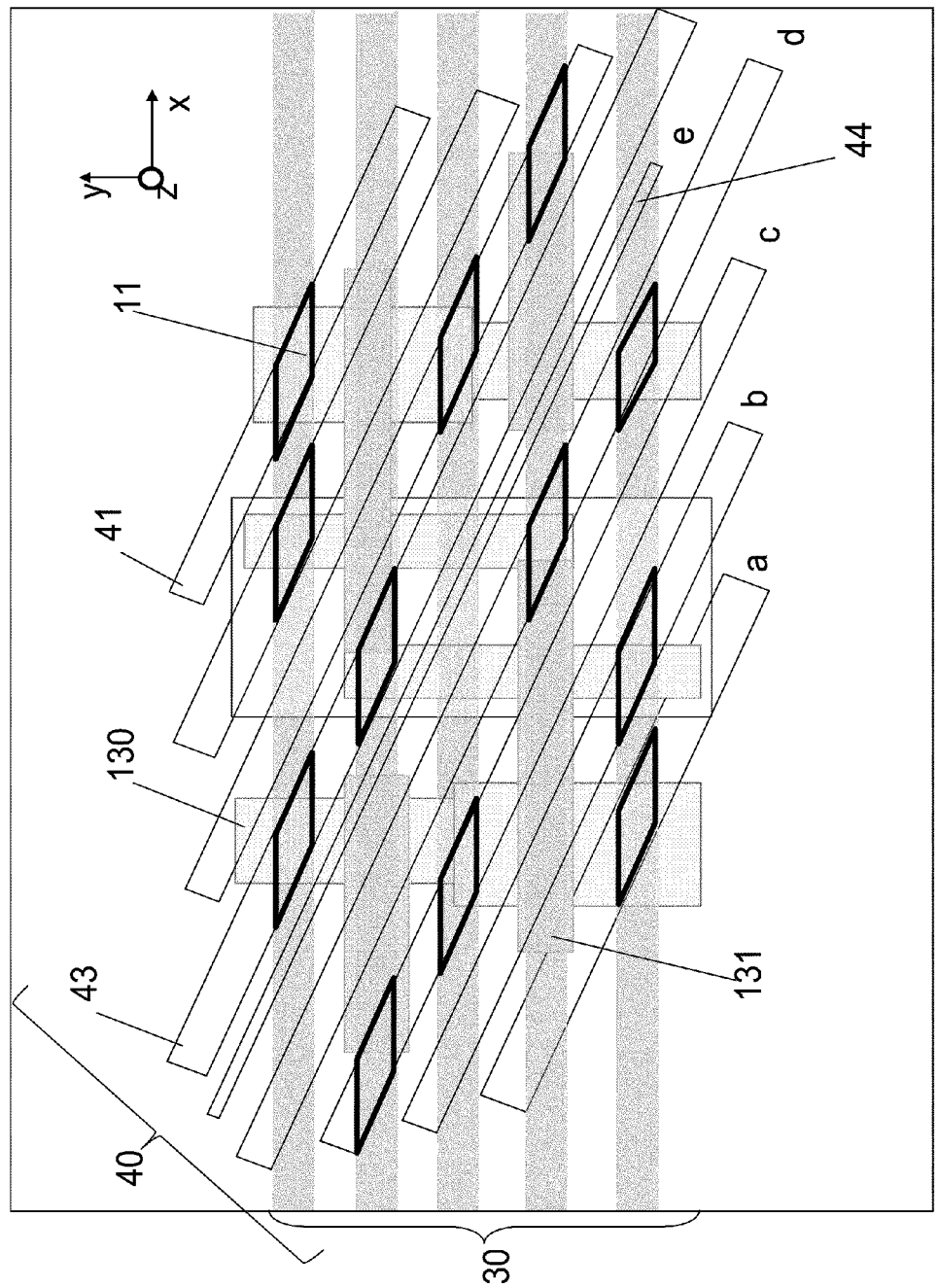

FIG. 6, which includes FIGS. 6a and 6b, illustrates an embodiment of the invention in forming contacts oriented in particular direction for a 6T SRAM cell. FIG. 6a illustrates a layout of a 6T SRAM cell. FIG. 6a illustrates the contacts 20 formed by the mask set of FIG. 6b.

Figure 7A:
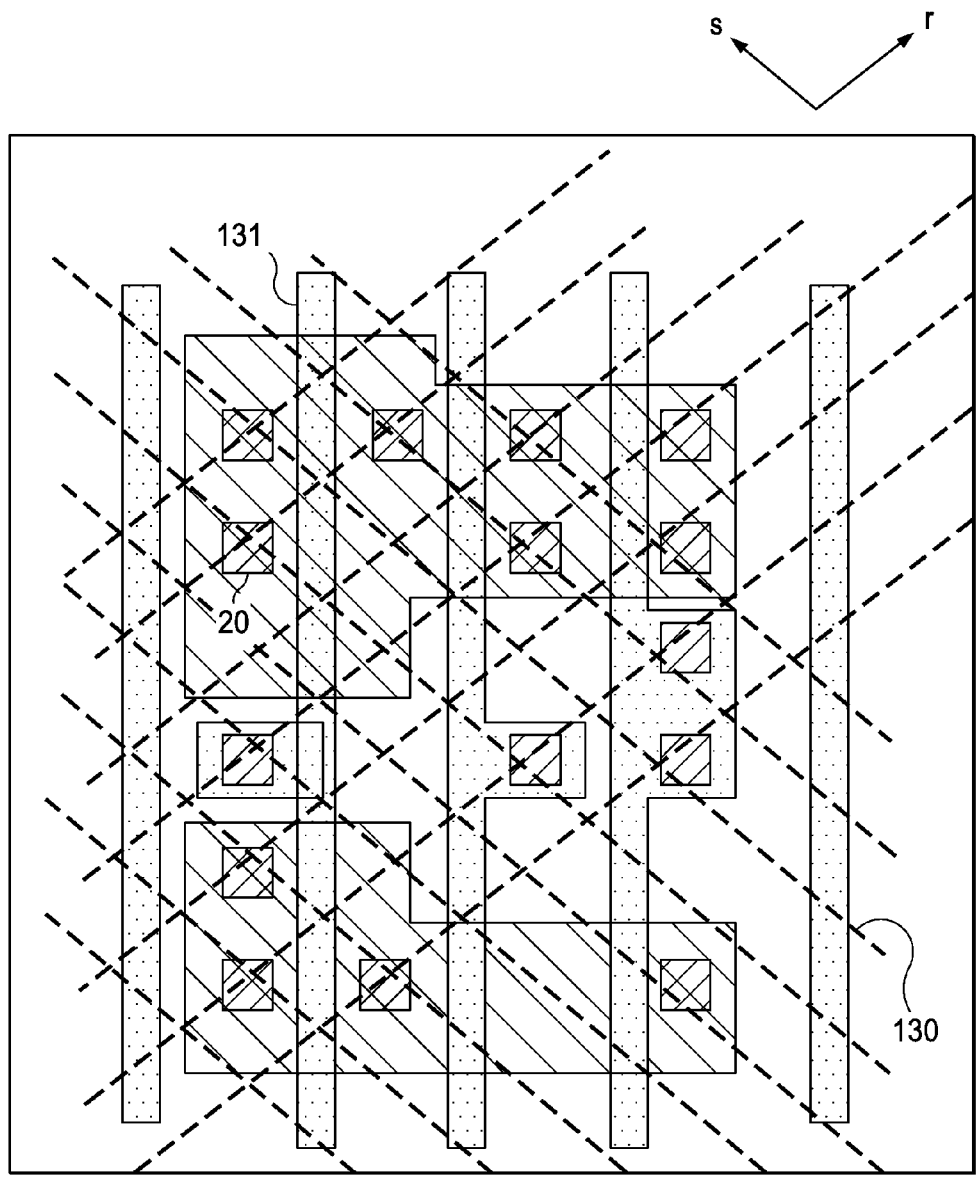
FIGS. 7a and 7b, illustrates a NAND cell designed or fabricated in accordance with embodiments of the invention.

Referring to FIG. 6a, the 6T SRAM cell comprises a first and a second access transistor A1 and A2, a first and a second NMOS transistor N1 and N2, and a first and second PMOS transistor P1 and P2. The transistors are formed by forming active regions 130 separated by isolation regions 140. The transistors comprise gate lines 131, pwell regions 132, and nwell regions 133 that also include the channel, source/drain regions of the transistors. As illustrated in FIG. 7a, the contacts 20 are formed at the intersection of the grid that is formed by lines parallel to a first axis (x-axis) and a second axis (line r). The contacts 20 couple the active regions 130 or the gate regions 131. The contacts 20 are longer in a horizontal direction (x-axis) and parallel to the gate lines 131, thus allowing formation of contacts in tight spaces between the gate lines 131.

FIG. 6b illustrates the 6T SRAM cell with an overlay of the first and second masks 30 and 40. Hence, the pattern for contacts 11 is formed in regions commonly exposed by the first mask 30 and the second mask 40. The first mask 30 comprises lines parallel to the x-axis while the second mask 40 comprises lines parallel to each other and oriented at a non-orthogonal angle to the x-axis.

The second mask 40 comprises a plurality of lines comprising first, second, third, fourth, and fifth rows a-e. The second and third rows, b and c, for example, comprise a first plurality of lines 41. However, as described with the embodiments of FIGS. 4 and 5, not all the rows comprise the first plurality of lines 41. Hence, in this embodiment, the fifth row e comprises no contacts being formed (see FIG. 6a) and comprises auxiliary feature 44. The fourth row d comprises the second plurality of lines 43. The third mask 50 is not shown in FIG. 6b to maintain clarity, but is apparent from the lack of formation of pattern for contacts 11 in some of the common intersections.

As illustrated herein, the width of each of the pattern for contacts 11 along the y-axis is minimized using embodiments of the invention. As illustrated herein, using embodiments of the invention, the pattern for contacts 11 is formed in a highly scaled SRAM cell.

Figure 7B:
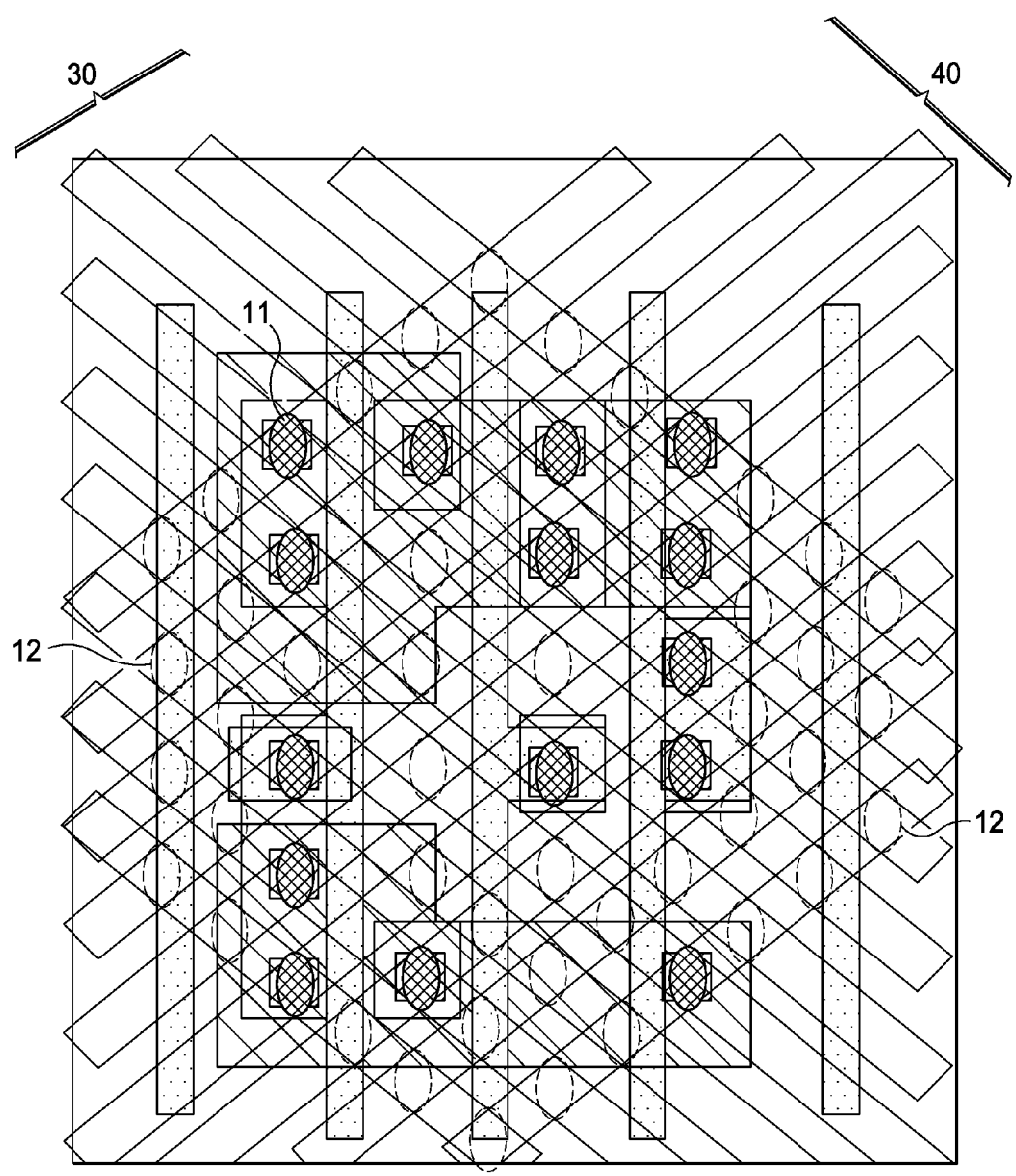

FIG. 7, which includes FIGS. 7a and 7b, illustrates a NAND cell in accordance with embodiments of the invention. The transistors are formed by forming active regions 130 separated by isolation regions. The transistors comprise gate lines 131, and active regions 130 that include the channel and source/drain etc of the transistors. As illustrated in FIG. 7a, the contacts 20 are formed at the intersection of the grid that is formed by lines parallel to first line (line r) and second line (line s).

FIG. 7b illustrates the NAND cell with an overlay of the first and the second masks 30 and 40. Hence, the pattern for contacts 11 are formed in regions commonly exposed by the first mask 30 and the second mask 40, but not formed in any regions under the third mask 50. The dummy contact patterns 12 illustrates the regions that are exposed by the first mask 30 and the second mask 40 but erased by the third mask 50.

FIG. 8, which includes FIGS. 8a-8f, illustrates an alternative embodiment of the process using an image reversal process.

Figure 8A:
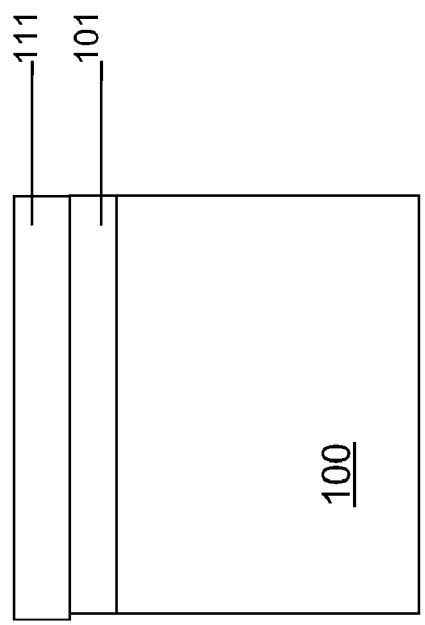
FIGS. 8a-8f, illustrates an alternative embodiment of the process using an image reversal process.

Referring to FIG. 8a, an insulating layer 101 to be patterned is deposited over a workpiece 100. In various embodiments, the insulating layer 101 is deposited over an etch stop liner (not shown). The insulating layer 101 preferably comprises insulating materials typically used in semiconductor manufacturing for inter-level dielectric (ILD) layers.

Figure 8B:
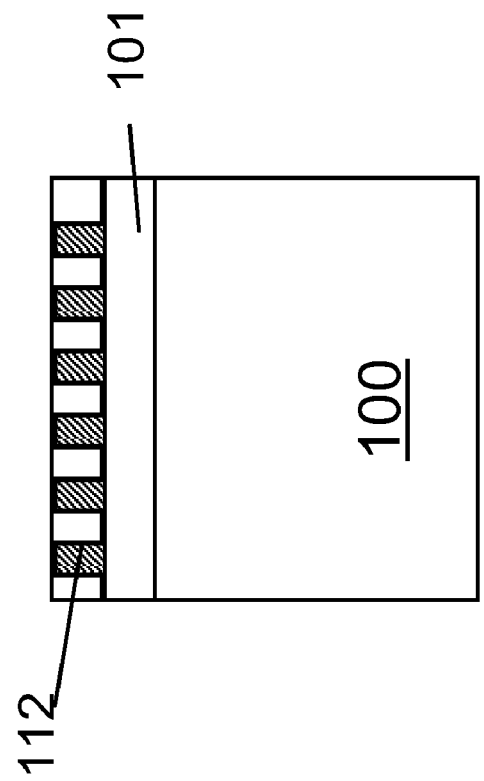

A photo resist layer 111 is deposited over the insulating layer 101 and exposed using a first mask (e.g., FIG. 3a) and a second mask (e.g., FIG. 3c). Exposed pillars 112 are thus formed as shown in FIG. 8b. Exposed pillars 112 are the regions of the photo resist layer 111 exposed with the first and the second mask.

Figure 8C:
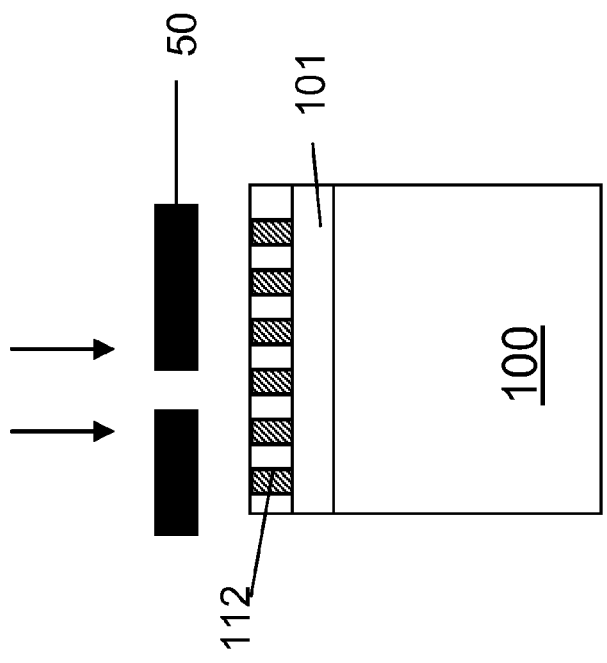
Figure 8D:
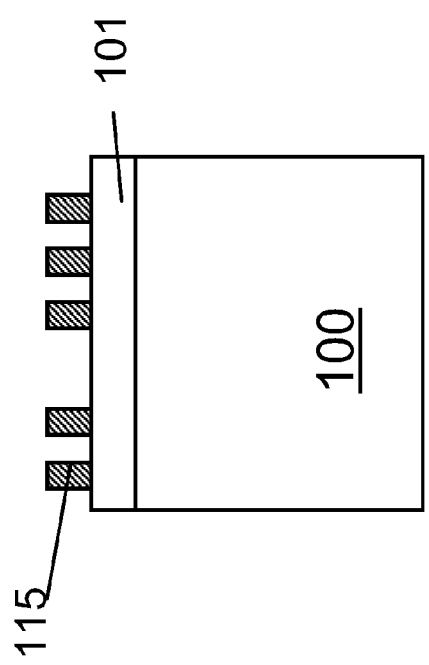

As illustrated in FIG. 8c, the exposed pillars 112 are exposed using a third mask 50. The photo resist layer 111 is developed to form resist pillars 115. Additional exposed pillars (portions of the exposed pillars 112 exposed with the third mask 50) are hence removed (FIG. 8d) using the third mask 50.

Figure 8E:
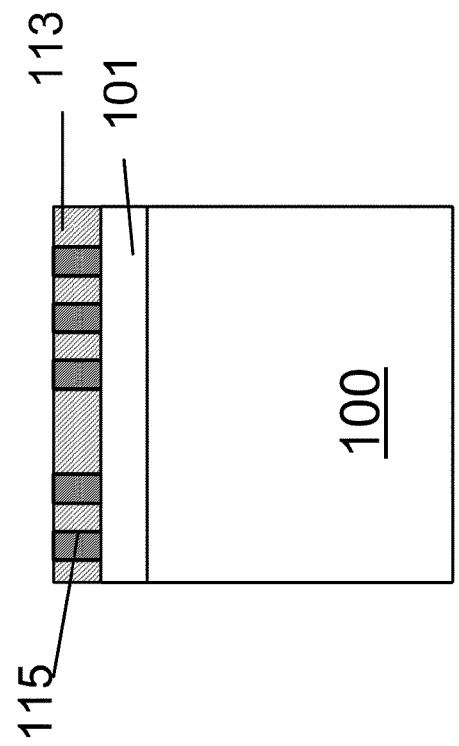
Figure 8F:
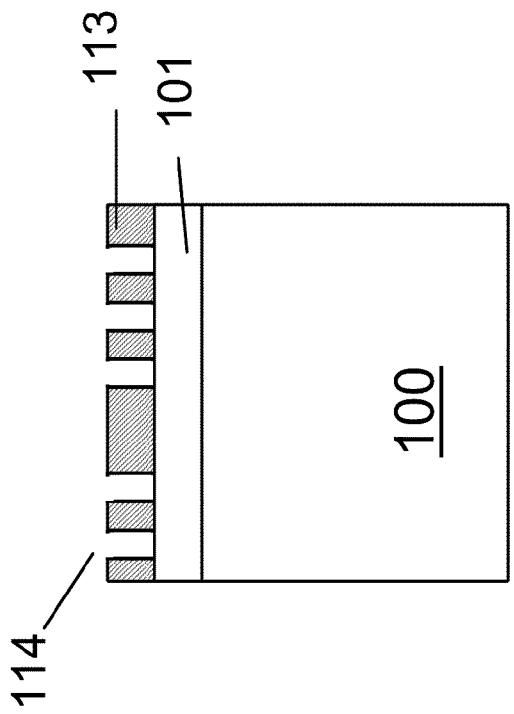

A spin on material 113 is coated onto the resist pillars 115 as shown in FIG. 8e. The resist pillars 115 are removed forming openings 114 for forming contact holes in the underlying insulating layer 101 (FIG. 8f). Using the openings 114, contact holes are subsequently etched in the insulating layer 101.

Although the contacts described above are for first metal levels, in various embodiments, vias coupling various metal levels can be formed using embodiments of the invention. Hence, in some embodiments some or all levels of vias are formed as gridded contacts using embodiments of the invention.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
    exposing a first photo resist layer using a first light beam thereby forming first features, wherein the first exposure is performed by the first light beam passing through a first dipole illuminator and then a first mask, wherein a dipole axis of the first dipole illuminator is oriented in a first direction; and
    after exposing the first photo resist layer, forming second features using a second exposure with a second light beam, wherein the second exposure is performed by the second light beam passing through a second dipole illuminator and then a second mask, wherein a dipole axis of the second dipole illuminator is oriented in a second direction, wherein the first, and the second features comprise a pattern for forming contact holes, and wherein the first direction and the second direction are not perpendicular.

2. The method of claim 1, wherein the first mask comprises a first plurality of lines oriented in a third direction, wherein the second mask comprises a second plurality of lines oriented in a fourth direction, wherein the third direction is perpendicular to the first direction, and wherein the second direction is perpendicular to the fourth direction.

3. The method of claim 2, wherein the first plurality of lines comprise first printable features, and first assist features, the first printable features forming the first features.

4. The method of claim 3, wherein the first assist features comprise sub resolution features.

5. The method of claim 3, wherein the first assist features comprise printing assist features and are removed using a third mask.

6. The method of claim 3, wherein the second plurality of lines comprise second printable features, and second assist features, the second printable features forming the second features.

7. The method of claim 6, wherein the second assist features are not printed and comprise sub resolution features.

8. The method of claim 6, wherein the second assist features comprise printing assist features and are removed using a third mask.

9. The method of claim 1, further comprising removing a portion of the first and/or second features using a third mask.

10. The method of claim 1, wherein the second features are formed in a second photo resist layer.

11. The method of claim 10, further comprising:
    developing and etching the exposed first photo resist layer to form the first features;
    freezing the first features;
    coating the second photo resist layer after freezing the first features;
    developing and etching the exposed second photo resist layer to form the second features; and
    freezing the second features.

12. The method of claim 11, further comprising forming an insulating layer over the substrate, wherein the first photo resist layer is coated over the insulating layer.

13. The method of claim 11, further comprising etching the insulating layer using the first, the second, and the third features as patterns.

14. The method of claim 10, wherein the first photo resist and the second photo resist are each a positive tone resist.

15. The method of claim 10, wherein the first photo resist and the second photo resist are each a negative tone resist.

16. The method of claim 1, further comprising:
    after forming second features, exposing the first and the second features to a third exposure through a third mask, the second features being formed in the first photo resist layer;
    removing portions of the first or the second features exposed by the third exposure;
    coating a spin on material on the remaining first and second features; and
    removing the first and second features to form openings for patterning contact holes.

17. The method of claim 1, wherein transistors are formed in a substrate under the first photo resist layer before exposing the first photo resist layer.

18. A method of manufacturing a semiconductor device, the method comprising:

forming a first photo resist over a substrate;

passing a first light beam through a first dipole illuminator and then a first mask to form first features on the first photo resist, the first mask comprising a first and a second plurality of lines oriented in a first direction, wherein the first plurality of lines form the first features, and the second plurality of lines comprise assist features, wherein a dipole axis of the first dipole illuminator is oriented in a second direction perpendicular to the first direction;

forming a second photo resist over the first photo resist; and passing a second light beam through a second dipole illuminator and then a second mask to form second features on the second photo resist, the second mask comprising a third plurality of lines oriented in a third direction, wherein a dipole axis of the second dipole illuminator is oriented in a fourth direction perpendicular to the third direction.

19. The method of claim 18, wherein the first direction and the third direction are not perpendicular.

20. The method of claim 18, wherein the first and the second features comprise a pattern for forming contact holes.

21. The method of claim 18, wherein the first assist features are not printed and comprise sub resolution features.

22. The method of claim 18, wherein the first assist features comprise printing assist features and are removed using a third mask.

23. The method of claim 18, wherein the third plurality of lines comprise second printable features, and second assist features, the second printable features forming the second features.

24. The method of claim 23, wherein the second assist features are not printed and comprise sub resolution features.

25. The method of claim 23, wherein the second assist features comprise printing assist features and are removed using a third mask.

26. The method of claim 18, further comprising:
developing and etching the exposed first photo resist layer to form the first features;
freezing the first features;
coating the second photo resist layer after freezing the first features;
developing and etching the exposed second photo resist layer to form the second features; and
freezing the second features.

27. A semiconductor device comprising:
a first plurality of contacts disposed over a first region of a substrate, the first plurality of contacts being disposed as rows and columns on a first grid, wherein the rows and columns of the first grid are not perpendicular to each other; and
a second plurality of contacts disposed over a second region of a substrate, the second plurality of contacts being disposed as rows and columns on a second grid, wherein the rows and columns of the second grid are not perpendicular to each other.

28. The device of claim 27, wherein the first grid and the second grid are different.

29. The device of claim 27, wherein each row of the first plurality of contacts is spaced by a first distance, and each column of the first plurality of contacts is spaced by a second distance, and wherein each row of the second plurality of contacts is spaced by a third distance, and each column of the second plurality of contacts is spaced by a fourth distance.

* * * * *